United States Patent [19]
Takata

[11] Patent Number: 5,111,267
[45] Date of Patent: May 5, 1992

[54] SEMICONDUCTOR DEVICE HAVING A MULTILAYER ELECTRODE STRUCTURE AND METHOD FOR FABRICATING THE SAME

[75] Inventor: Ikunori Takata, Fukuoka, Japan

[73] Assignee: Mitsubishi Denki Kabushiki Kaisha, Tokyo, Japan

[21] Appl. No.: 584,059

[22] Filed: Sep. 18, 1990

[30] Foreign Application Priority Data

Sep. 29, 1989 [JP] Japan .................................. 1-255926
Sep. 11, 1990 [JP] Japan .................................. 2-241418

[51] Int. Cl.⁵ .................... H01L 29/72; H01L 27/02; H01L 29/34
[52] U.S. Cl. ........................ 357/36; 357/35; 357/46; 357/49; 357/52
[58] Field of Search ............ 357/35, 36, 46, 52, 357/49

[56] References Cited

U.S. PATENT DOCUMENTS

| | | | |
|---|---|---|---|
| 4,283,733 | 8/1981 | Aumura | 357/36 |
| 4,646,125 | 2/1987 | Takagi | 357/46 |
| 4,827,322 | 5/1989 | Takata | 357/46 |
| 4,994,880 | 2/1991 | Kato et al. | 357/36 |

FOREIGN PATENT DOCUMENTS 2050289 4/1971 Fed. Rep. of Germany .

OTHER PUBLICATIONS

Japanese Patent Laying Opening Gazette-62-143454.

Primary Examiner—Andrew J. James
Assistant Examiner—Ngan V. Ngo
Attorney, Agent, or Firm—Oblon, Spivak, McClelland, Maier & Neustadt, P.C.

[57] ABSTRACT

Disclosed herein is such multilayer electrode structure of transistor and thyristor that a second electrode region serving as an upper layer electrode region is formed on a second semiconductor region which is an active region and an insulating film which is formed on a first electrode region serving as an underlayer electrode region, whereby the second electrode region is directly in contact with the second semiconductor region for electrical connection. According to such electrode structure, the second electrode region is also formed on the insulating film while being in stable electrical connection with the second semiconductor region even if the same is formed by vacuum deposition. Thus, it is possible to obtain a semicondutor device having multilayer structure, which can be fabricated at a low cost and is excellent in electrode forming area efficiency.

6 Claims, 23 Drawing Sheets

SEMICONDUCTOR DEVICE HAVING A MULTILAYER ELECTRODE STRUCTURE AND METHOD FOR FABRICATING THE SAME

BACKGROUND OF THE INVENTION

1. Field of the Invention

The present invention relates to a semiconductor device having multilayer electrode structure.

2. Description of the Prior Art

FIG. 1A is a plan view showing a conventional power transistor, and FIG. 1B is a sectional view taken along the line C1-C1 in FIG. 1A. As shown in these figures, an $N^-$-type collector layer 2 is formed on an $N^+$-type collector layer 1. A P-type well region 3 is formed on an upper layer part of the $N^-$-type collector layer 2 by diffusing a P-type impurity. A plurality of $N^+$-type emitter regions 4 are partially formed on the surface of the P-type well region 3 by selectively diffusing an N-type impurity of high concentration. Oxide films 5 are selectively formed over the P-type well region 3 and parts of the N-type collector layer 2 provided with no P-type well region 3 as well as regions over the P-type well region 3 and the $N^{30}$-type emitter regions 4. FIG. 1A shows no such oxide films 5, in order to avoid complicatedness of the plan view. A base electrode 16 is formed on the P-type well region 3 while an emitter eletctrode 17 is formed on the $N^{30}$-type emitter regions 4 to be insulated from each other.

In the power transistor having such structure, the emitter electrode 17 is formed on the $N^{30}$-type emitter regions 4 in a finger-like manner, and hence distribution of current flowing in the emitter electrode 17 is inuniformalized due to longitudinal positional differences between the $N^+$-type emitter regions 4, to hinder supply of large current. Further, refinement of the emitter electrode 17 is extremely limited due to etching work accuracy in formation of he electrodes since the base electrode 16 must be provided between the $N^+$-type emitter regions 4, to hinder high speed operation at turn-off time etc.

Thus, it has been difficult to realize the supply of large current and high-speed operation without damaging the degree of integration in the structure of the power transistor shown in FIGS. 1A and 1B.

In order to solve the aforementioned problems, there has been proposed a power transistor having two-layer electrode structure, as shown in FIGS. 2A and 2B. FIG. 2A is a plan view showing such a power transistor having two-layer electrode structure, and FIG. 2B is a sectional view taken along the line C2-C2 in FIG. 2A.

As shown in these figures, an interlayer isolation film 9 is formed to entirely cover the upper surface of a base electrode 16 which is formed between portions of an emitter electrode 17 except for a part 16' of the base electrode 16. An emitter electrode 27 is formed on a tetragonal region including all $N^{30}$-type emitter regions 4. This emitter electrode 27 is in contact with the entire emitter electrode 17 which is provided under the same, while being entirely insulated from a base region 3, which is provided under the emitter electrode 27, through the interlayer isolation film 9. A base electrode 26 is further formed on the part 16' of the base electrode 16 provided with no interlayer isolation film 9. The electrodes are thus provided in two layers (16 and 17; 25 and 27) to increase the formation area of the emitter electrode 27 without deteriorating the degree of integration, thereby enabling supply of large current and high speed operation.

Thus, the semiconductor device of multilayer electrode structure has been generally employed in order to increase the formation areas of the electrodes without deteriorating the degree of integration.

In the conventional multilayer electrode structure, however, the second-layer electrodes 26 and 27 must necessarily be formed on the first-layer electrodes 16 and 17. In general, such electrodes are formed of aluminum. For example, it is necessary to selectively form the interlayer insulation film 9 after formation of the first-layer electrodes 16 and 17 in the power transistor shown in FIGS. 2A and 2B, while there is a strong probability that oxide films are formed on the surfaces of the electrodes 16 and 17 in formation of the interlayer isolation film 9. When the electrodes 26 and 27 are formed on the surfaces of the electrodes 16 and 17 being in such states, electrical barriers are inevitably defined between the pairs of electrodes 16 and 26 as well as 17 and 27.

In order to form a second-layer electrode on a first-layer electrode, therefore, it is necessary to clean the surface of the first layer electrode before forming the second-layer electrode. Thus, the second-layer electrode is preferably formed by a sputtering process, not by a generally employed vapor deposition process. This is because the surface of the first layer electrode is cleaned by sputter etching in the sputtering process in advance of accumulation of an aluminum film for forming the second-layer electrode.

However, although the sputtering process is excellent in fabrication of an aluminum film of about 1 $\mu$m in thickness, it requires excessive time and cost in order to form a relatively thick aluminum film of 4 to 10 $\mu$m in thickness for a power transistor. This is because the sputtering process is higher in apparatus cost and slower in aluminum accumulation rate as compared with the vacuum deposition process.

SUMMARY OF THE INVENTION

In the first aspect, a semiconductor device according to the present invention comprises a first conductivity type first semiconductor layer having first and second major surfaces, a second conductivity type first semiconductor region selectively formed on the first major surface of the first semiconductor layer wherein the first semiconductor region has first and second portions, and the first portion is much longer than the second portion, a first conductivity type second semiconductor region selectively formed on a surface of the first semiconductor region, a low-resistance region selectively formed on the surface of the first semiconductor region separately from the second semiconductor region, a first electrode region formed on the first portion of the first semiconductor region and a part of the low resistance region and having first and second portions, an insulating film formed to cover the first portion of the first electrode region, a second electrode region formed on the second semiconductor region and the insulating film, and a third electrode region formed on the second portion of the first semiconductor region, on another part of the low-resistance region and on the second portion of the first electrode.

In the second aspect, a semiconductor device according to the present invention comprises a first conductivity type first semiconductor layer, a second conductivity type first semiconductor region selectively formed on the first semiconductor layer, a first conductivity type second semiconductor region selectively formed on a surface of the first semiconductor region, a second conductivity type third semiconductor region selectively formed on the first semiconductor layer separately from the first semiconductor region, a first conductivity type fourth semiconductor region selectively formed on a surface of the third semiconductor region, a first electrode region formed on the first semiconductor region and the fourth semiconductor region, an insulating film formed to cover the first electrode region, a second electrode region formed on the second semiconductor region and the insulating film, and a third electrode region formed on the third semiconductor region and the insulating film separately from the second electrode region.

In the third aspect, a semiconductor device according to the present invention comprises a first conductivity type first semiconductor layer, a second conductivity type first semiconductor region selectively formed on the first semiconductor layer, a first conductivity type second semiconductor region selectively formed on a surface of the first semiconductor region, a second conductivity type third semiconductor region selectively formed on the first semiconductor layer separately from the first semiconductor region, a first conductivity type fourth semiconductor region selectively formed on a surface of the third semiconductor region, a first conductivity type fifth semiconductor region selectively formed on a surface of the first semiconductor region separately from the second semiconductor region, a first electrode region formed on the first semiconductor region and the fourth semiconductor region, an insulating film formed to cover the first electrode region, a second electrode region formed on the second semiconductor region and the insulating film, and a third electrode region formed on the third semiconductor region, the fifth semiconductor region and the insulating film separately from the second electrode region.

In the fourth aspect, a method of fabricating a semiconductor device according to the present invention comprises of the steps of preparing a first conductivity type first semiconductor layer, selectively forming a second conductivity type first semiconductor region on he first semiconductor layer, selectively forming a first conductivity type second semiconductor region on a surface of the first semiconductor region, forming a first electrode region having first and second portions on a most region of the first semiconductor region, forming an insulating film to cover the first portion of the first electrode region, forming a second electrode region on the second semiconductor region and the insulating film, and forming a third electrode region on the first semiconductor region provided with no the first electrode and the second portion of the first electrode.

In the fifth aspect, a method of fabricating a semiconductor device according to the present invention comprises the steps of preparing a first conductivity type first semiconductor layer, selectively forming a second conductivity type first semiconductor region on the first semiconductor layer, selectively forming a first conductivity type second semiconductor region on a surface of the first semiconductor region, selectively forming a second conductivity type third semiconductor region on the first semiconductor layer separately from the first semiconductor region, selectively forming a first conductivity type fourth semiconductor region on a surface of the third semiconductor region, forming a first electrode region on the first semiconductor region and the fourth semiconductor region, forming an insulating film to cover the first electrode region, forming a second electrode region on the second semiconductor region and the insulating film, and forming a third electrode region on the third semiconductor region and the insulating film separately from the second electrode region.

In the sixth aspect, a method of fabricating a semiconductor device according to the present invention comprises the step of preparing a first conductivity type first semiconductor layer, selectively forming a second conductivity type first semiconductor region on the first semiconductor layer, selectively forming a first conductivity type second semiconductor region on a surface of the first semiconductor region, selectively forming a second conductivity type third semiconductor region on the first semiconductor layer separately from the first semiconductor region, selectively forming a first conductivity type fourth semiconductor region on a surface of the third semiconductor region, selectively forming a first conductivity type fifth semiconductor region on a surface of the first semiconductor region separately from the second semiconductor region, forming a first electrode region on the first semiconductor region and the fourth semiconductor region, forming an insulating film to cover the first electrode region, forming a second electrode region on the second semiconductor region and the insulating film, and forming a third electrode region on the third semiconductor region, the fifth semiconductor region and the insulating film separately from the second electrode region.

According to the present invention, a second electrode region serving as an upper layer electrode region is formed on a second semiconductor region and on an insulating film, so that the second electrode region is in contact with the second semiconductor region for attaining electrical connection.

Accordingly, an object of the present invention is to obtain a semiconductor device having multilayer electrode structure, which can be fabricated at a low cost with excellent electrode forming area efficiency.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
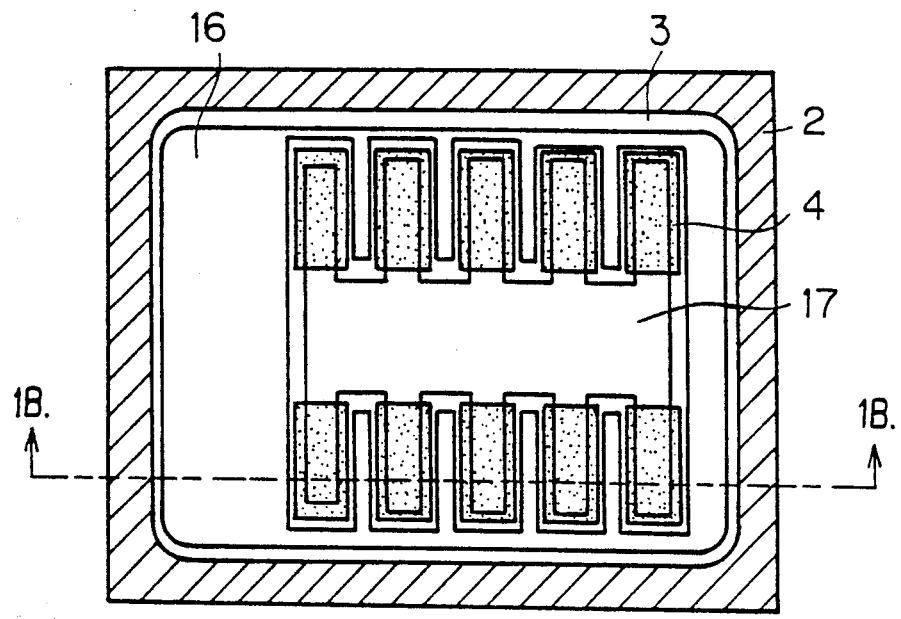
FIG. 1A is a plan view showing a conventional power transistor having single-layer electrode structure.
Figure 1B:
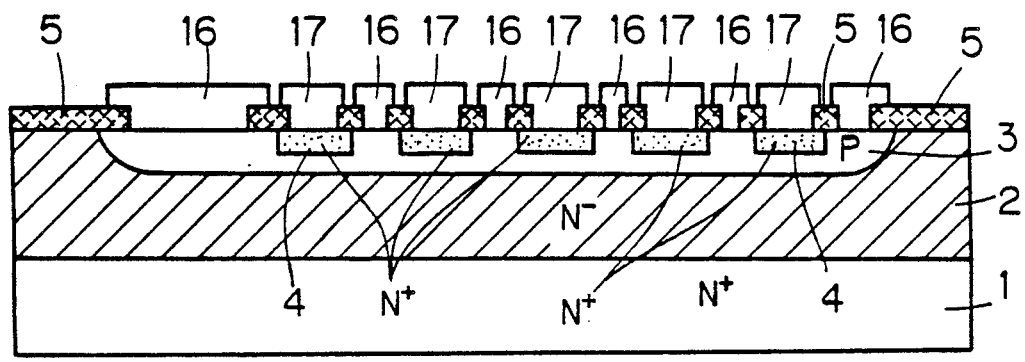
FIG. 1B is a sectional view taken along the line C1–C1 in FIG. 1A.
Figure 3A:
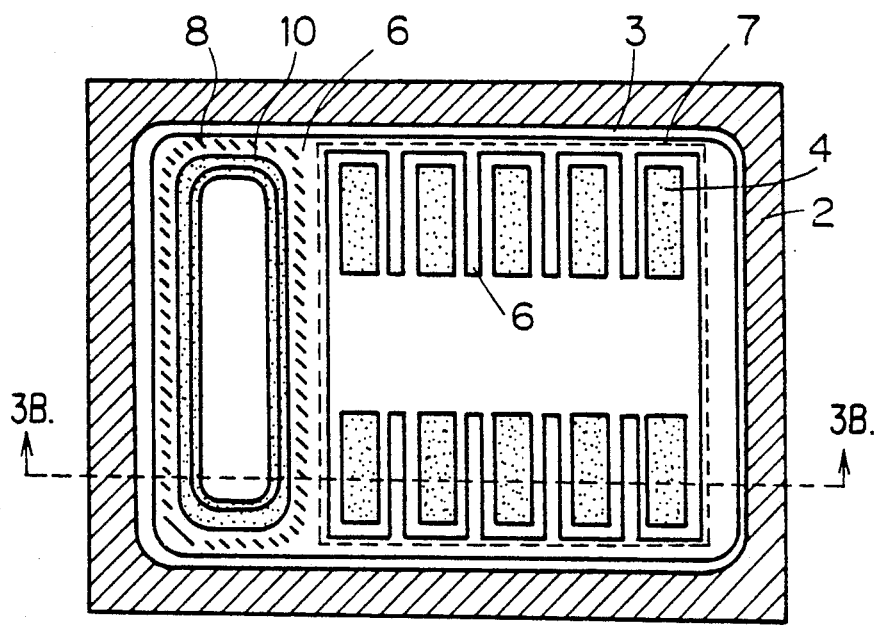
FIG. 3A is a plan view showing a power transistor according to the first embodiment of the present invention.
Figure 3B:
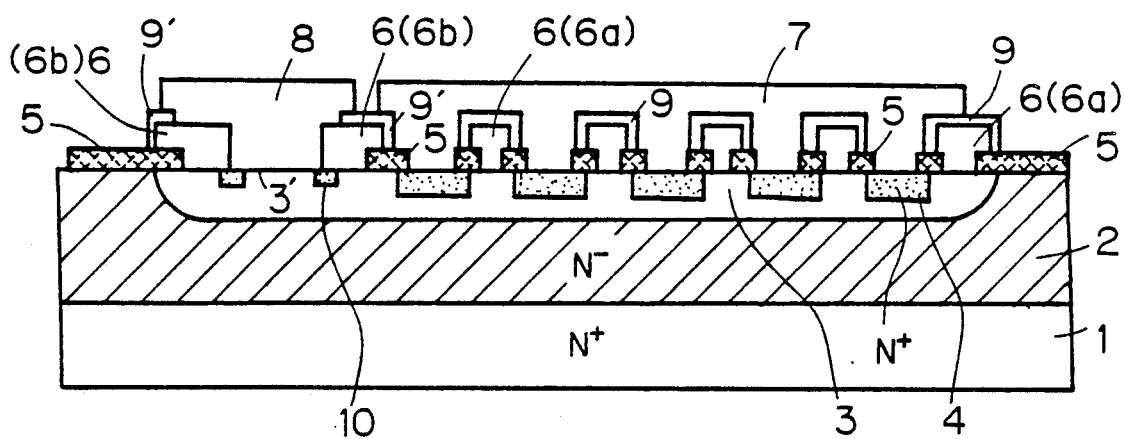
FIG. 3B is a sectional view taken along the line C3–C3 in FIG. 3A.
Figure 2A:
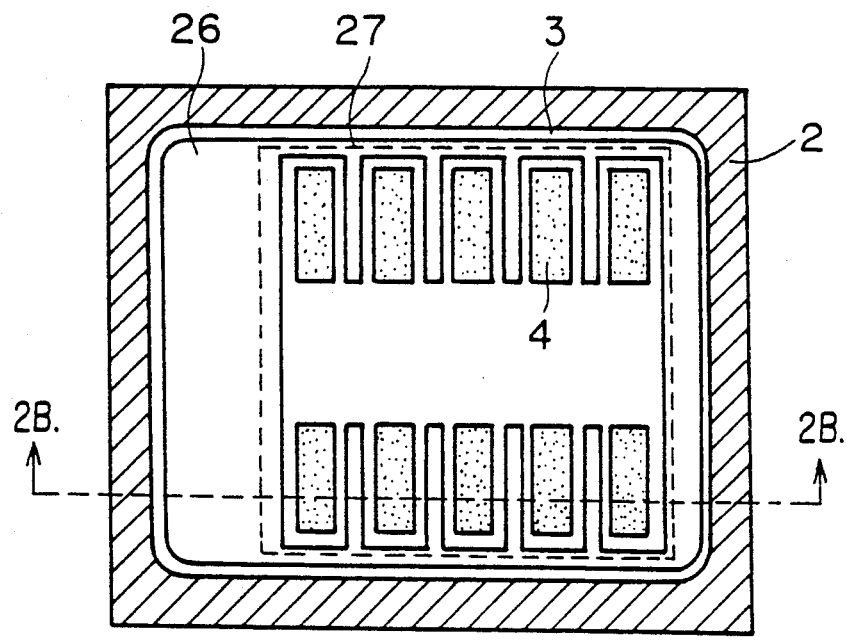
FIG. 2A is a plan view showing a conventional power transistor having two-layer electrode structure.
Figure 2B:
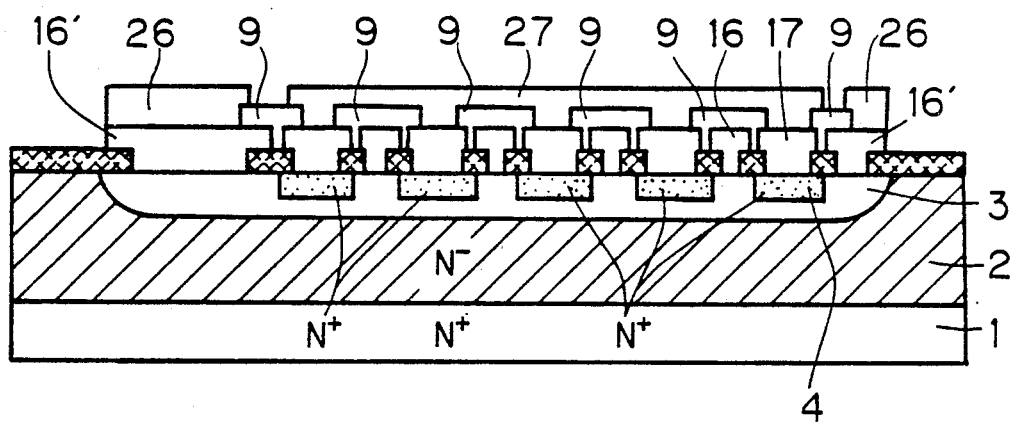
FIG. 2B is a sectional view taken along the line C2–C2 in FIG. 2A.

FIG. 3A is a plan view showing a power transistor according to the first embodiment of the present invention, and FIG. 3B is a sectional view taken along the line C3–C3 in FIG. 3A. As shown in these figures, an $N^-$-type collector layer 2 is formed on an $N^{30}$-type collector layer 1. A P-type well region 3 is formed in an upper layer part of the $N^-$-type collector layer 2 by diffusing a P-type impurity. A plurality of $N^{30}$-type emitter regions 4 are partially formed on the surface of the P-type well region 3 by selectively diffusing an N-type impurity of high concentration. A low-resistance region 10 is provided in the form of a ring on a part of the surface of the P-type well region 3 which is provided with no $N^+$-type emitter region 4. Oxide films 5 are selectively formed over the P-type well region 3 and the surface part of the $N^-$-type collector layer 2 which is provided with no P-type well region 3, as well as a region over the P-type well region 3 and the $N^{30}$-type emitter region 4. FIG. 3A illustrates no such oxide films 5, in order to avoid complicatedness of the plan view.

A base electrode 6 consists of a base electrode 6a and a base electrode 6b. The base electrode 6a is formed over a region extending on parts of the P type well region 3 held between the oxide films 5 and on parts of the oxide films 5. The base electrode 6b is formed over a region extending on parts of the P-type well region 3 held between the oxide film 5 and the low-resistance region 10, on parts of the said oxide films 5 and on parts of the low-resistance regions 10.

The overall region 6a of the base electrode 6 is covered with an interlayer insulation film 9. Such an interlayer insulation film 9 also covers the oxide films 5 and surface parts of the region 6b. FIG. 3A shows no interlayer insulation film 9, in order to avoid complicatedness of the plan view. It is noted that plan views showing the second to sixth embodiments of the present invention also show no parts corresponding to the oxide films 5 and he interlayer insulation film 9 in order to facilitate understanding of the plan views. A tetragonal emitter electrode 7 is formed substantially entirely over the $N^+$-type emitter regions 4 and the interlayer insulation film 9, to be directly in contact with the $N^{30}$-type emitter regions 4. On the other hand, a base bonding region 8 is formed over a part of the P-type well region 3 held within the low-resistance region 10 and parts of the region 6b of the base electrode 6, to be not in contact with the emitter eletctrode 7.

Figure 4A:
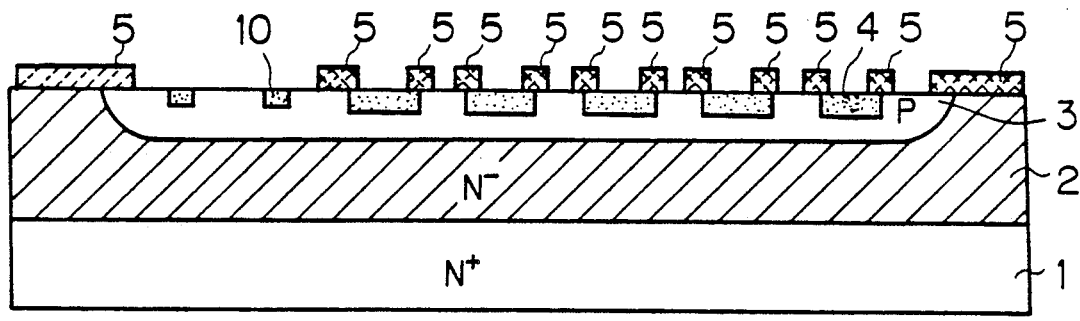
FIGS. 4A to 4C are sectional views showing a method of fabricating the power transistor according to the first embodiment.
Figure 4B:
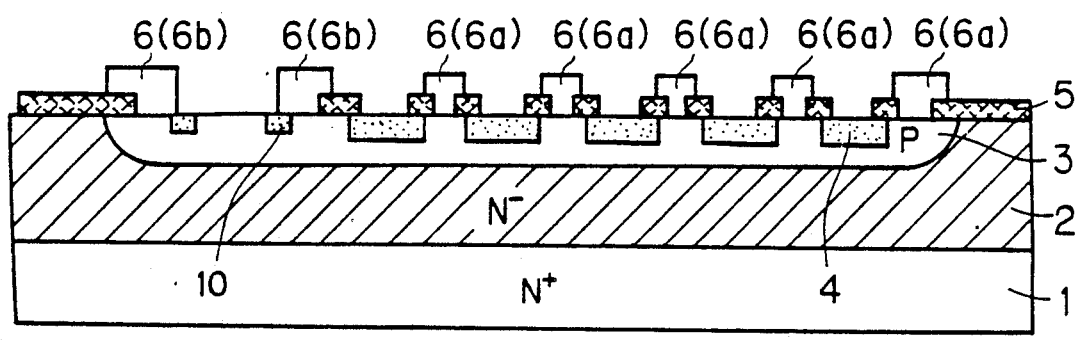
Figure 4C:
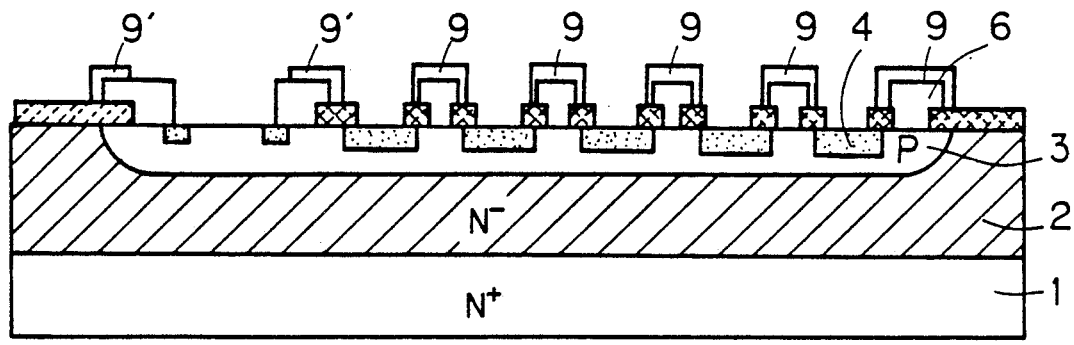

FIGS. 4A to 4C are sectional views showing a method of fabricating the power transistor according to the first embodiment. This method is now described with reference to these figures.

First, the $N^{30}$-type collector layer 1, the $N^-$-type collector layer 2, the P-type well region 3, the $N^{30}$-type emitter regions 4 and the low-resistance region 10 are formed by well-known methods. The low-resistance region 10 is simultaneously formed with the $N^{30}$-type emitter regions 4. An oxide film is formed over the entire surface and then etched to define the oxide films 5 in the regions close to the boundaries between the N+-type emitter regions 4 and the P-type well region 3 and over the N−-type collector layer 2 and end portions of the P-type well region 3, as shown in FIG. 4A.

Then, an aluminum layer is formed over the entire surface by vacuum deposition and subjected to selective etching to leave parts thereof on the region (6a) extending over the parts of the P-type well region 3 held between the oxide films 5 and parts of the said oxide films 5 as well as on the region (6b) extending over the parts of the P-type well region 3 held between the oxide films 5·and the low-resistance region 10 as well as the oxide films 5 and the parts of the low-resistance region 10, thereby to form the base electrode 6 as shown in FIG. 4B.

Then, an insulating film is formed over the entire surface and thereafter subjected to selective etching to leave portions covering the region 6a and parts of the region 6b, thereby to form the interlayer insulation film 9 as shown in FIG. 4C. While the interlayer insulation film 9 is generally prepared from polyimide, the material therefor is not restricted to polyimide but may be prepared from glass having a low melting point, for example, which can be formed at a temperature below that employed in a step of forming an aluminum eletctrode.

Aluminum is again vacuum-deposited over the entire surface and subjected to etching for forming the emitter electrode 7 on a tetragonal region including the overall emitter regions 4 to be in contact with the N+-type emitter regions 4, as well as forming the base bonding region 8 on a part 3′ of the P-type well region 3 and the region 6b of the base electrode 6 to be in contact with the part 3′ of the P-type well region 3, as shown in FIGS. 3A and 3B.

Although the power transistor thus fabricated has two-layer electrode structure, the emitter electrode 7 and the base bonding region 8 corresponding to upper layer regions are directly in contact with the N30-type emitter regions 4 and the P-type well region 3 respectively. Therefore, it is not necessary to consider electrical barriers in contact portions between two-layer electrodes. Thus, a power transistor having multilayer electrode structure can be formed with no function degradation by the vacuum deposition process, which is capable of high-speed processing at a low cost as compared with the sputtering process which is costly and takes much time.

A contact region of two-layer electrodes is partially defined between the base electrode 6 and the base bonding region 8, to cause an electrical barrier similarly to the prior art when the base bonding region 8 is formed by vacuum deposition. However, this barrier can be regarded as not much problematic for the following reasons:

(1) The base bonding region 8 has a sufficient direct contact area with the part 3′ of the P-type well region 3.

(2) Electrical contact between the base bonding region 8 and the base electrode 6 can be sufficiently attained through the low-resistance region 10 without through the contact region defined therebetween.

If the surface region of the P-type well region 3 has low resistance, the base electrode 6 and the base bonding region 8 can be maintained in sufficient electrical connection through the surface region of the P-type well region 3, even if the low-resistance region 10 is omitted.

Figure 5A:
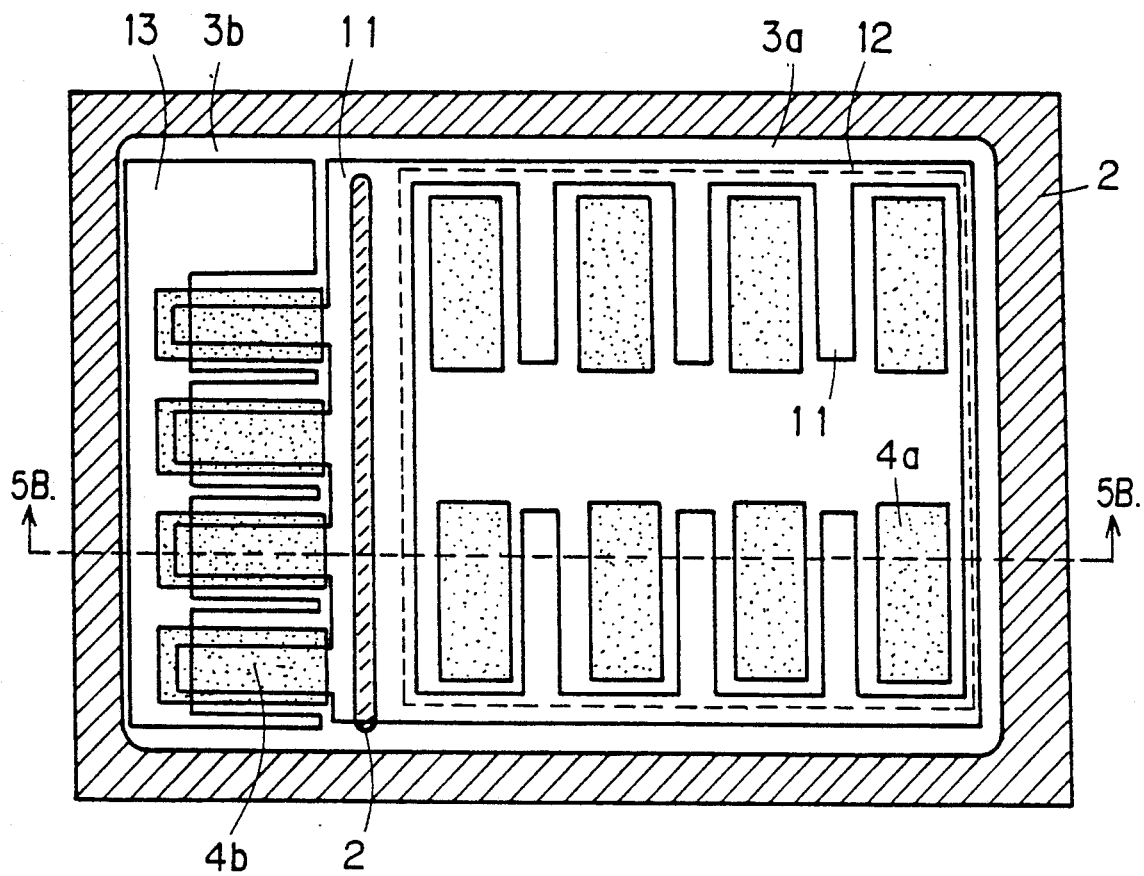
FIG. 5A is a plan view showing a power transistor having two-stage Darlington-connected structure according to the second embodiment of the present invention.
Figure 5B:
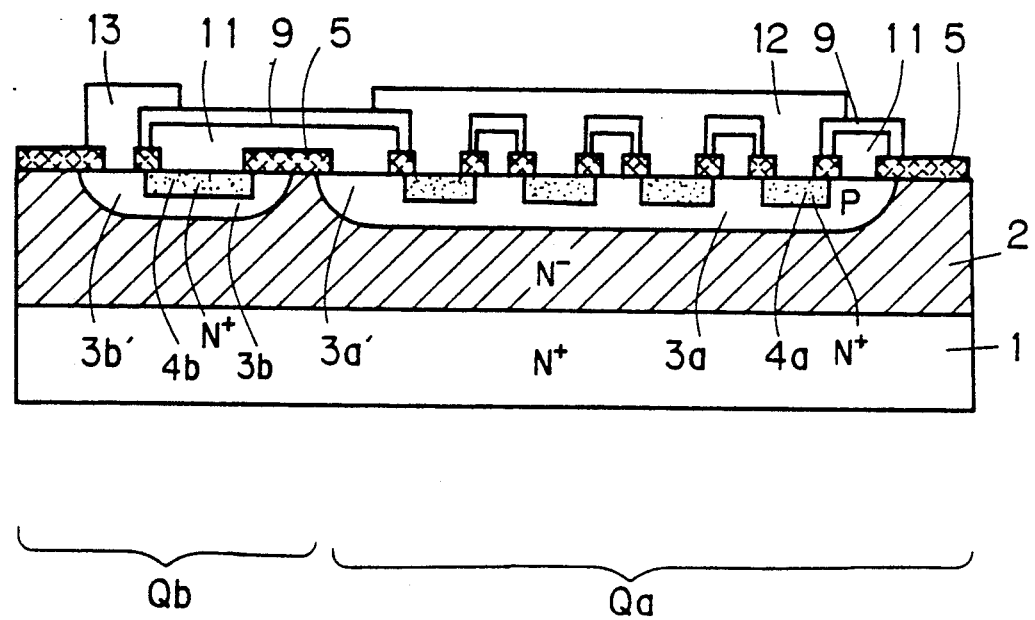
FIG. 5B is a sectional view taken along the line C4–C4 in FIG. 5A.

FIG. 5A is a plan view showing a power transistor having two-stage Darlington-connected structure according to the second embodiment of the present invention, and FIG. 5B is a sectional view taken along the line C4–C4 in FIG. 5A. As shown in these figures, an N−-type collector layer 2 is formed on an N30-type collector layer A P-type well region 3a for serving as a base region of a transistor Qa and another P-type well region 3b for serving as a base region of another transistor Qb are selectively formed on an upper layer part of the N−-type collector layer 2. A plurality of N+-type emitter regions 4a and a plurality of N−-type emitter regions 4b are formed on partial regions of the P-type well regions 3a and 3b respectively.

Oxide films 5 are formed on a region over a surface part of the N−-type collector layer 2 (right-hand side in FIG. 5B) and a part of the P-type well region 3a, regions close to boundaries between the P-type well region 3a and the N+-type emitter regions 4a, regions over the P-type well region 3a and regions close to boundaries between the P-type well region 3b and the N+-type emitter regions 4b through a surface part of the N−-type collector layer 2, regions close to the boundaries between the N+-type emitter regions 4b and the P-type well region 3b and a region over the P-type well region 3b and the surface of the N−-type collector layer 2.

A base/emitter electrode 11, which is an electrode connecting the base of the transistor Qa with the emitter of the transistor Qb, is formed over the P-type well region 3a, a part 3a′ of the P-type well region 3a and the N+-type emitter regions 4b. An interlayer insulation film 9 is formed to cover the base/emitter electrode 11. An emitter electrode 12 of the transistor Qa is formed on a tetragonal region including the overall N+-type emitter regions 4a to be in contact with the N+-type emitter regions 4a, while a base electrode 13 of the transistor Qb is formed on a part 3b′ of the P-type well region 3b. These electrodes 12 and 13 also serve as bonding regions.

Figure 5C:
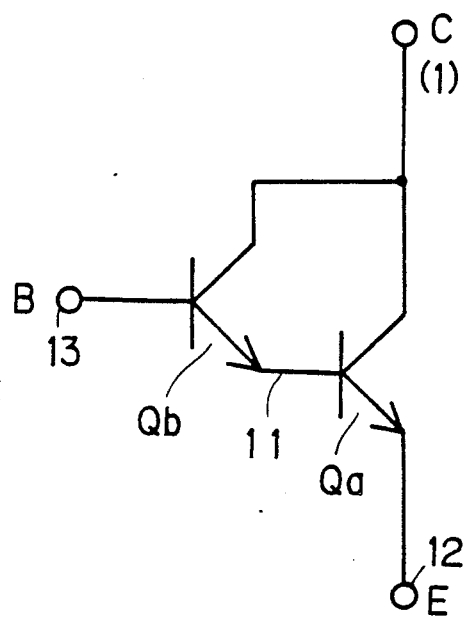
FIG. 5C is an equivalent circuit diagram of the embodiment shown in FIG. 5A.

FIG. 5C is an equivalent circuit diagram of the transistors Qa and Qb shown in FIGS. 5A and 5B. As shown in FIG. 5C, the base/emitter electrode 11 electrically connects the base and the emitter of the transistors Qa and Qb which are adjacent to each other, while the emitter electrode 12 serves as the emitter electrode of the transistor Qa of the final stage (second stage) capable of external connection by bonding and the base electrode 13 serves as the base electrode of the transistor Qb capable of external connection by bonding.

FIGS. 6A to 6D are sectional views showing a method of fabricating the power transistor according to the second embodiment. With reference to these figures, the fabrication method will now be described.

Figure 6A:
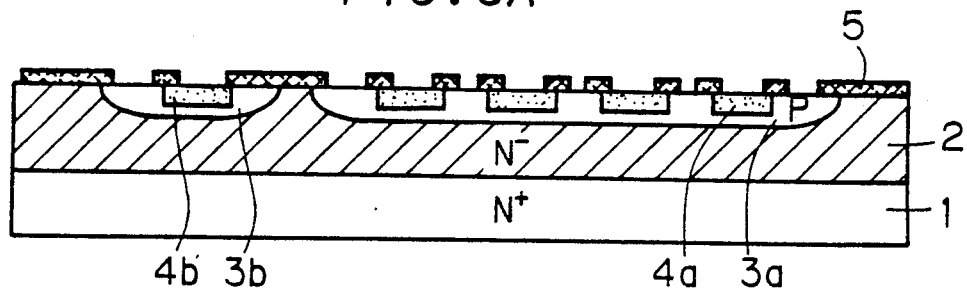
FIGS. 6A to 6D are sectional views showing a method of fabricating the power transistor according to the second embodiment.

First, the N+-type collector layer 1, the N−-type collector layer 2, the P-type well regions 3a and 3b and the N+-type emitter regions 4a and 4b are formed by well-known fabrication methods. Then, the aforementioned oxide films 5 are selectively formed as shown in FIG. 6A.

Figure 6B:
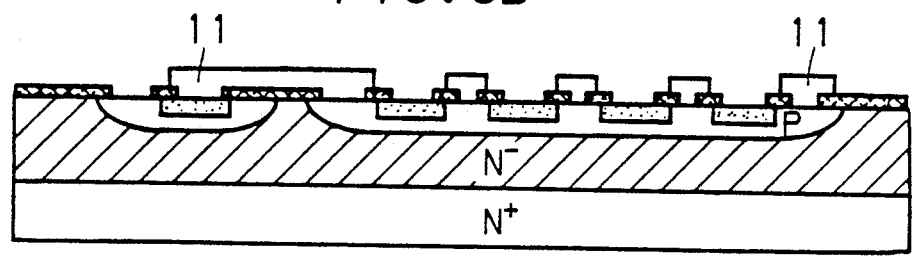
Figure 6C:
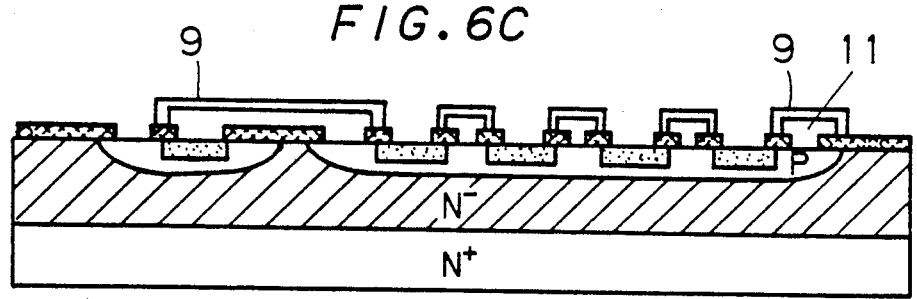

Then, an aluminum layer is formed over the entire surface by vacuum deposition and subjected to etching processing, thereby to form the base/emitter electrode 11 of the aforementioned configuration, as shown in FIG. 6B. Thereafter the base/emitter electrode 11 is covered with the interlayer insulation film 9, as shown in FIG. 6C.

Figure 6D:
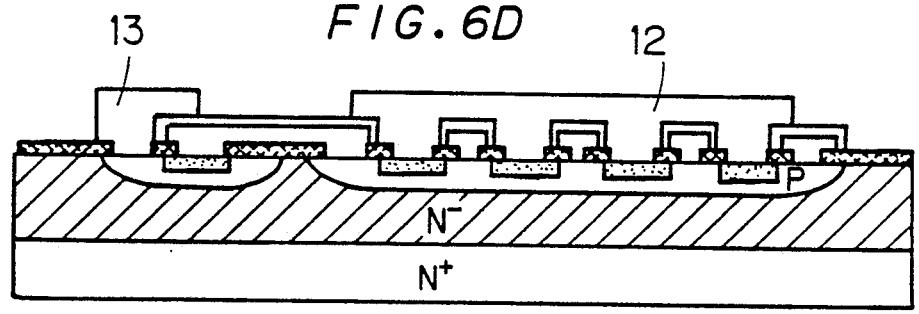

An aluminum layer is again formed over the entire surface by vacuum deposition and subjected to etching processing, thereby to form the emitter electrode 11 and the base electrode 13 of the aforementioned configurations, as shown in FIG. 6D.

In the power transistor thus fabricated, the emitter electrode 12 and the base electrode 13 corresponding to upper layer regions are directly in contact with the emitter regions 4a and the P-type well region 3b respectively, although the power transistor has two-layer structure. Thus, a power transistor having two-stage Darlington-connected structure can be formed by vacuum deposition with no function degradation, similarly to the first embodiment.

Figure 7A:
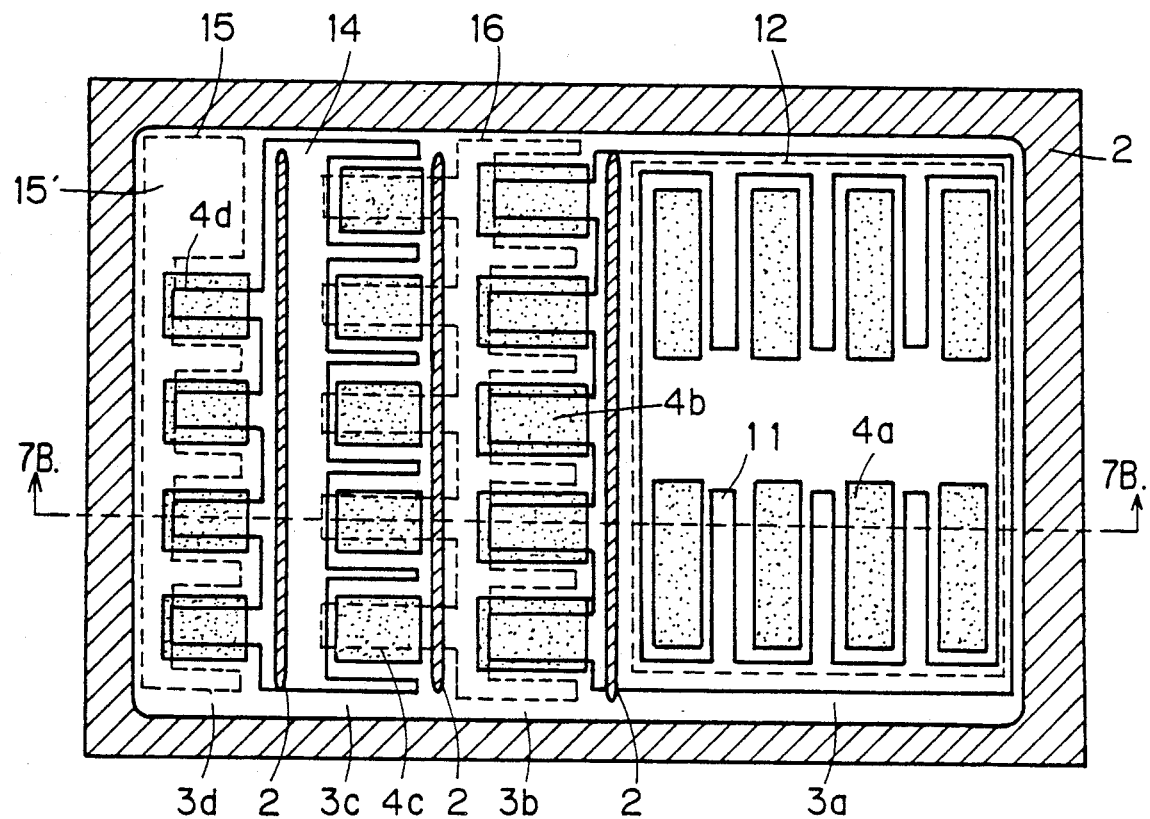
FIG. 7A is a plan view showing a power transistor having four-stage. Darlington-connected structure according to the third embodiment of the present invention.
Figure 7B:
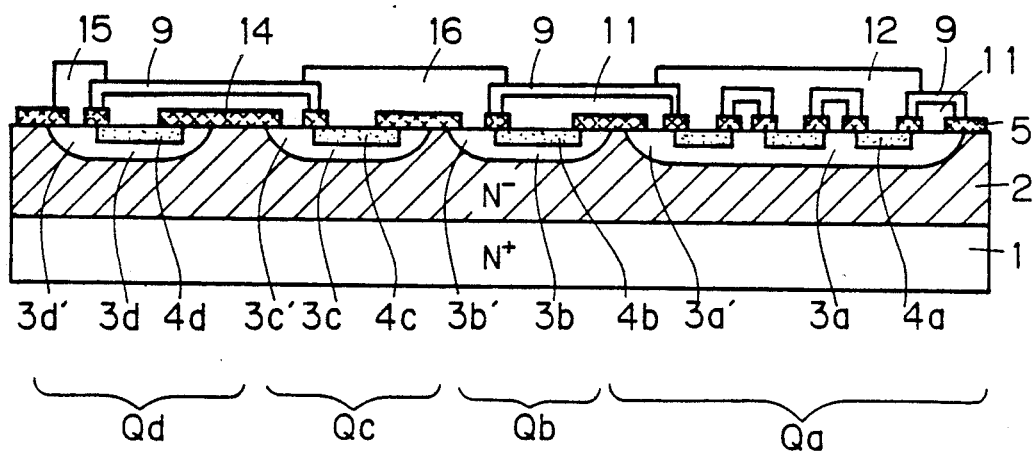
FIG. 7B is a sectional view taken along the line C5–C5 in FIG. 7A.

FIG. 7A is a plan view showing a power transistor having four-stage Darlington-connected structure according to the third embodiment of the present invention, and FIG. 7B is a sectional view taken along the line C5–C5 in FIG. 7A. As shown in these figures, an $N^-$-type collector layer 2 is formed on an $N^+$-type collector layer 1. P-type well regions 3a to 3d are formed on an upper layer part of the $N^-$-type collector layer 2, to serve as base regions of transistors Qa to Qb respectively. Pluralities of $N^{30}$-type emitter regions 4a to 4d are formed on partial regions of the P-type well regions 3a to 3d respectively.

Oxide films 5 are selectively formed on the following regions:

(1) a region over the $N^-$-type collector layer 2 and an end portion of the P-type well region 3a (2) regions close to boundaries between the P-type well region 3a and the $N^{30}$-type emitter regions 4a (3) regions over another end portion of the P-type well region 3a and regions close to boundaries between the P-type well region 3b and the $N^{30}$-type emitter regions 4b through the $N^-$-type collector layer 2

(4) regions close to the boundaries between the P-type well region 3b and the $N^+$-type emitter regions 4b (5) regions over an end portion of the P-type well region 3b and regions close to boundaries between the P-type well region 3c and the $N^{30}$-type emitter regions 4c through the $N^-$-type collector layer 2

(6) regions close to the boundaries between the P-type well region 3c and the $N^{30}$-type emitter regions 4c (7) regions over an end portion of the P-type well region 3c and regions close to boundaries between the P-type well region 3d and the $N^+$-type emitter regions 4d through the $N^-$-type collector layer 2

(8) region close to the boundaries between the P-type well region 3d and the $N^{30}$-type emitter regions 4d (9) a region over an end portion of the P-type well region 3d and the $N^-$-type collector layer 2

A base/emitter electrode 11, which is an electrode connecting the base of the transistor Qa and the emitter of the transistor Qb, is formed over the P-type well region 3a, a part 3a' of the P-type well region 3a and the $N^+$-type emitter regions 4b. Another base/emitter electrode 14, which is an electrode connecting the base of the transistor Qc and the emitter of the transistor Qd, is formed over a part 3c' of the P-type well region 3c and the $N^+$-type emitter regions 4d.

An interlayer insulation film 9 is formed to cover the base/emitter electrodes 12 and 14. An emitter electrode 12 of the transistor Qa is formed on a tetragonal region including the $N^+$type emitter regions 4a to be in contact with the $N^+$-type emitter regions 4a, while a base electrode 15 of the transistor Qd is formed on a part 3d' of the P-type well region 3d. Further, a base/emitter electrode 16 connecting the base of the transistor Qb with the emitter of the transistor Qc is formed over a part 3b' of the P-type well region 3b and the $N^{30}$-type emitter regions 4c. A partial region 15' of the base electrode 15 serves as a bonding region.

Figure 7C:
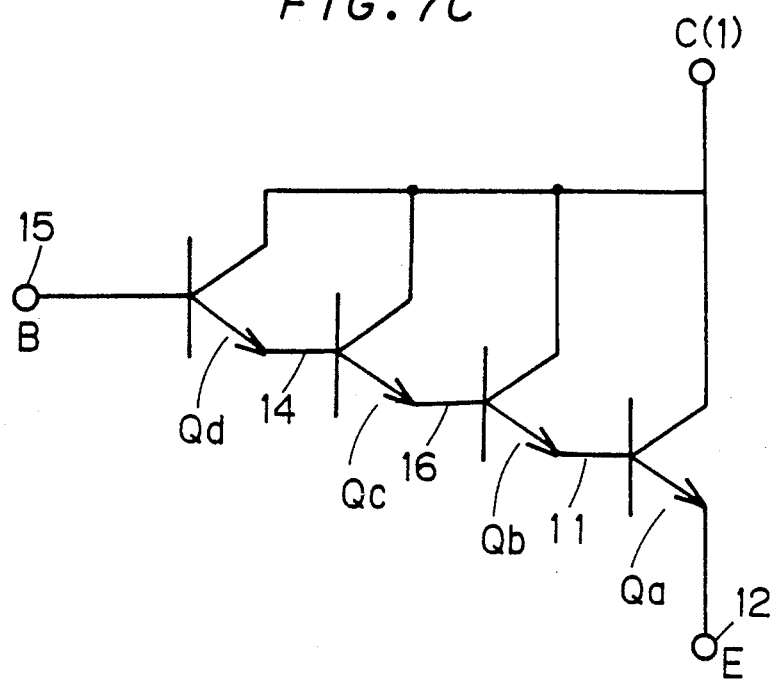
FIG. 7C is an equivalent circuit diagram of the embodiment shown in FIG. 7A.

FIG. 7C is an equivalent circuit diagram of the power transistor having the aforementioned four-stage Darlington-connected structure. As shown in FIG. 7C, the base/emitter electrodes 11, 14 and 16 electrically connect the bases and the emitters of the adjacent pairs of transistors, while the emitter electrode 12 serves as the emitter eletctrode of the transistor in the final stage (fourth stage) capable of external connection by bonding and the base electrode 15 serves as the base electrode of the first stage transistor Qd capable of external connection by bonding.

Detailed description of a method of fabricating the power transistor having four-stage Darlington-connected structure according to the third embodiment is omitted since the same is substantially similar to that of fabricating the power transistor having two-stage Darlington-connected structure according to the second embodiment. According to the third embodiment, the base/emitter electrodes 11 and 14 are formed in a first electrode forming step (corresponding to the step of the second embodiment shown in FIG. 6B), and the emitter electrode 12, the base/emitter electrode 16 and the base electrode 15 are formed in a second electrode forming step (corresponding to the step of the second embodiment shown in FIG. 6D).

In the power transistor according to the third embodiment, the emitter electrode 12, the base/emitter electrode 16 and the base electrode 15 corresponding to upper layer regions are directly in contact with the emitter electrodes 4a, the base region 3b' and the emitter regions 4c, and the base region 3d'' respectively, although the power transistor has two-layer electrode structure. Thus, a power transistor having four-stage Darlington-connected structure can be formed by vacuum deposition with no function degradation, similarly to the first and second embodiments.

Figure 8:
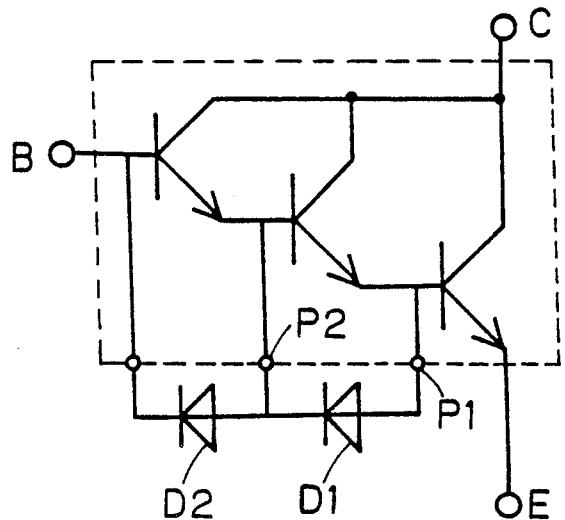
FIG. 8 is a circuit diagram showing an example of a Darlington-connected transistor provided with a speed-up diode.

In the case of a Darlington-connected transistor, externally provided speed-up diodes D1 and D2 are generally connected between each base and each emitter of adjacent transistors, as shown in FIG. 8. Thus, it is necessary to form external terminals P1 and P2, i.e., bonding regions, in an electrode for connecting adjacent base and emitter.

Figure 9A:
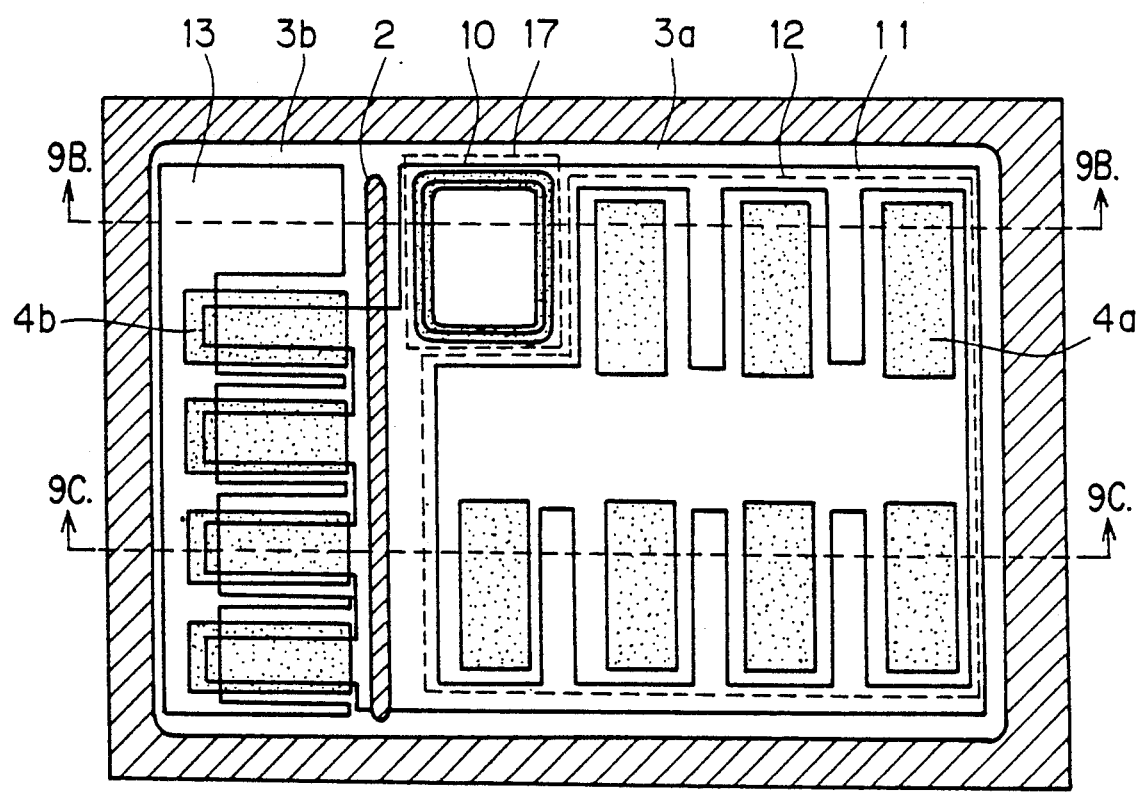
FIG. 9A is a plan view showing a power transistor having a two-stage Darlington-connected structure and provided with a base-to-emitter bonding region according to the fourth embodiment of the present invention.
Figure 9B:
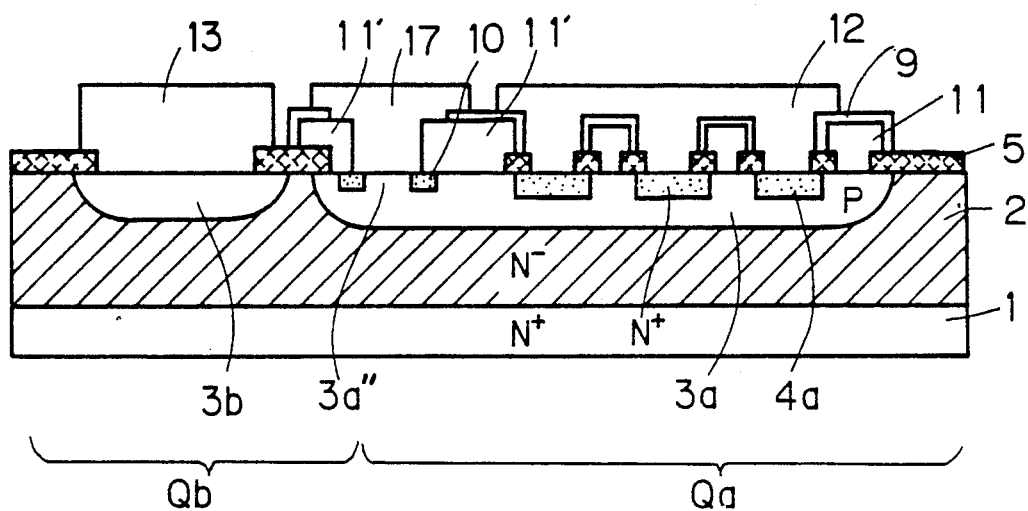
FIG. 9B is a sectional view taken along the line C6–C6 in FIG. 9A.
Figure 9C:
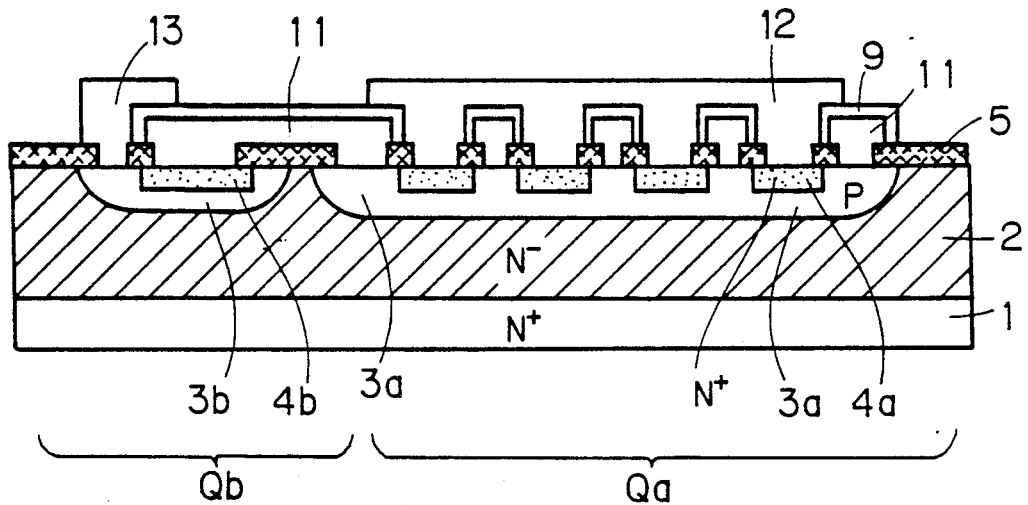
FIG. 9C is a sectional view taken along the line C7–C7 in FIG. 9A.

FIG. 9A is a plan view showing a power transistor having two-stage Darlington-connected structure and provided with a bonding region also in a base/emitter electrode according to the fourth embodiment of the present invention, and FIGS. 9B and 9C are sectional views taken along the lines C6–C6 and C7–C7 in FIG. 9A respectively. As shown in these figures, this power transistor is basically similar in structure to the power transistor according to the second embodiment, having two-stage Darlington-connected structure as shown in FIGS. 5A and 5B.

In the fourth embodiment, however, a base/emitter bonding region 17 is formed on a part 3a'' of a base region 3a and on a part 11' of a base/emitter electrode 11, in order to provide a bonding region also on an electrode eletctrically connecting the base of a transistor Qa with the emitter of another transistor Qb.

Similarly to the base bonding region 8 (see FIG. 3) of the first embodiment, the base/emitter bonding region 17 is formed over the base region 3a'' within a low-resistance region 10 which is selectively provided in the base region 3a and the base/emitter electrode 11', not to be electrically in contact with an emitter electrode 12 of the transistor Qa and a base electrode 13 of the transistor Qb.

Other structure of the fourth embodiment is similar to that of the second embodiment shown in FIGS. 5A and 5B, and hence redundant description is omitted.

Figure 9D:
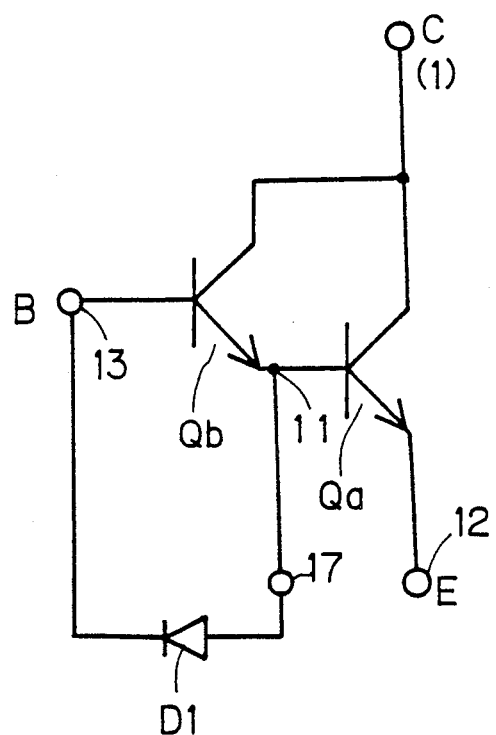
FIG. 9D is an equivalent circuit diagram of the embodiment shown in FIG. 9A.

FIG. 9D is an equivalent circuit diagram of the power transistor having the aforementioned two-stage Darlington connected structure. As shown in FIG. 9D, the base/emitter electrode 11 electrically connects the base and the emitter of the transistors Qa and QB, while the emitter electrode 12 serves as the emitter electrode of the transistor in the final stage (second stage) capable of external connection by bonding and the base electrode 13 serves as the base electrode of the first stage transistor Qb capable of external connection by bonding. The base/emitter bonding region 17 serves as the bonding region of the base/emitter electrode 11.

FIGS. 10A to 10D and 11A to 11D show a method of fabricating the power transistor according to the fourth embodiment. FIGS. 10A to 10D are sectional views taken along the line C6–C6 in FIG. 9A, and FIGS. 11A to 11D are sectional views taken along the line C7–C7 in FIG. 9A. With reference to FIGS. 10A to 10D and 11A to 11D, the fabrication method will now be described.

Figure 10A:
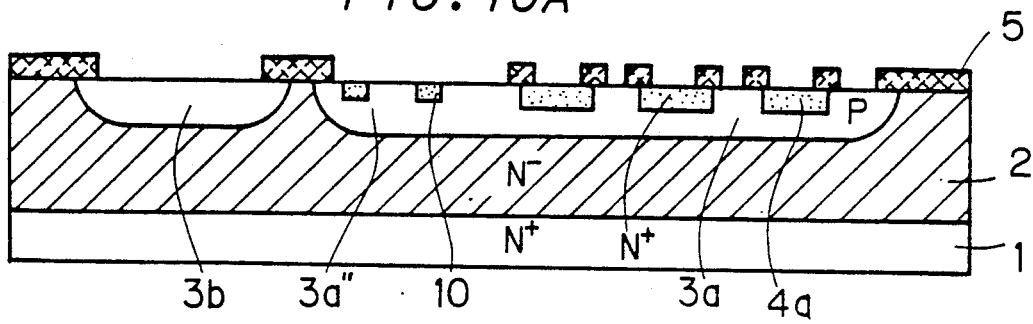
FIGS. 10A to 10D and 11A to 11D are sectional views showing a method of fabricating the power transistor according to the fourth embodiment.
Figure 11A:
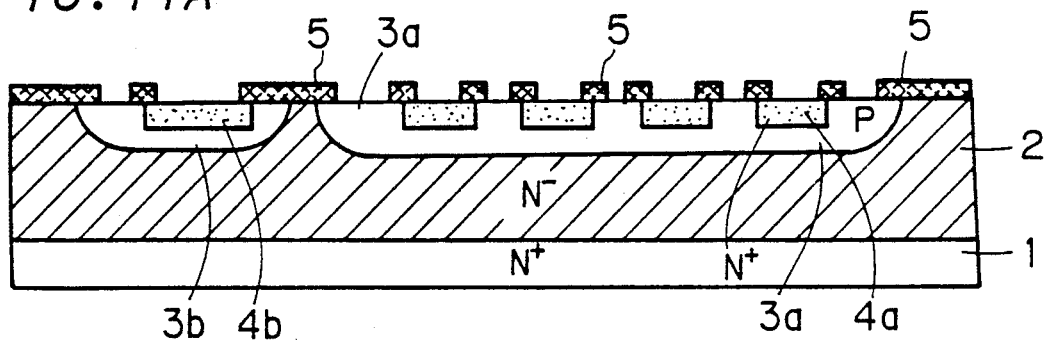

First, the $N^+$-type collector layer 1, the $N^-$-type collector layer 2, the P-type well regions 3a and 3b, the $N^{30}$-type emitter regions 4a and 4b and the low-resistance region 10 are formed by well-known fabrication methods. The low-resistance region 10 is formed simultaneously with the $N^{30}$-type emitter regions 4a and 4b. Then, oxide films 5 are formed on a region over the $N^-$-type collector layer 2 and an end portion of the P-type well region 3a, regions close to boundaries between the P-type well region 3a and the $N^{30}$-type emitter regions 4a, regions over another end portion of the P-type well region 3a and regions close to boundaries between the P-type well region 3b and the $N^{30}$-type emitter regions 4b or an end portion of the P-type well region 3b through the $N^-$-type collector layer 2, regions close to the boundaries between the P-type well region 3b and the $N^{30}$-type emitter regions 4b and a region over another end portion of the $P^-$-type well region 3b and the $N^-$-type collector layer 2, as shown in FIGS. 10A and 11A.

Figure 10B:
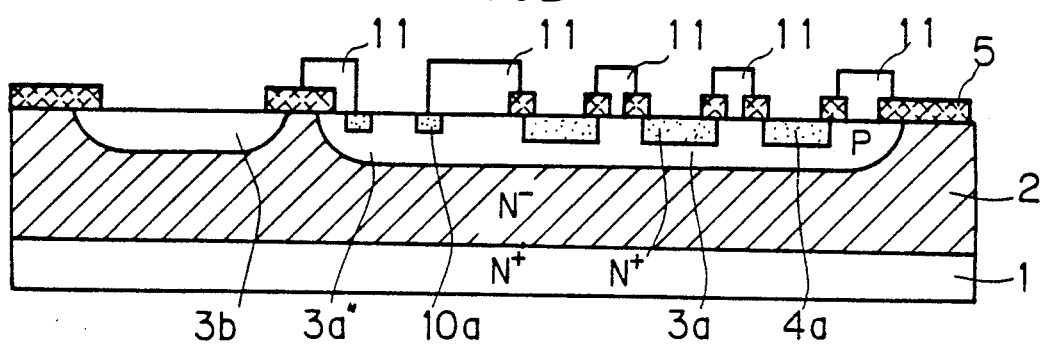
Figure 11B:
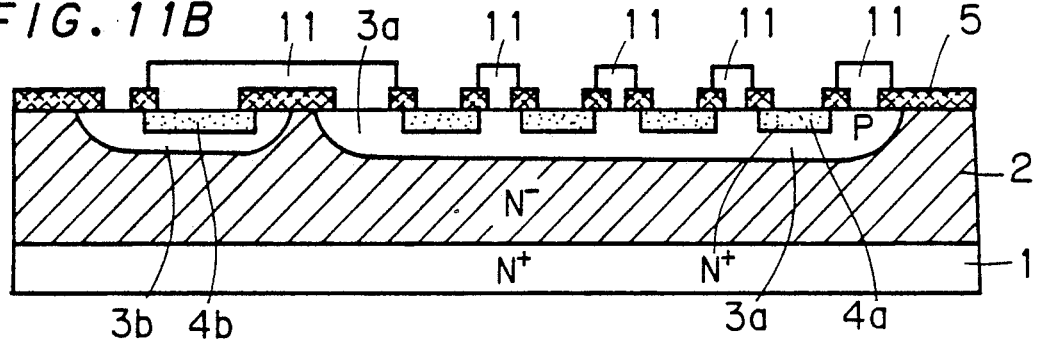

Then, an aluminum layer is formed over the entire surface by vacuum deposition and selectively etched to leave portions of the aluminum layer on a portion of the P-type well region 3a excluding the region 3a'' enclosed by the low-resistance region 10a and regions over a part 3a' of the P-type well region 3a and the $N^{30}$-type emitter regions 4b, thereby to form the base/emitter electrode 11 as shown in FIGS. 10B and 11B.

Figure 10C:
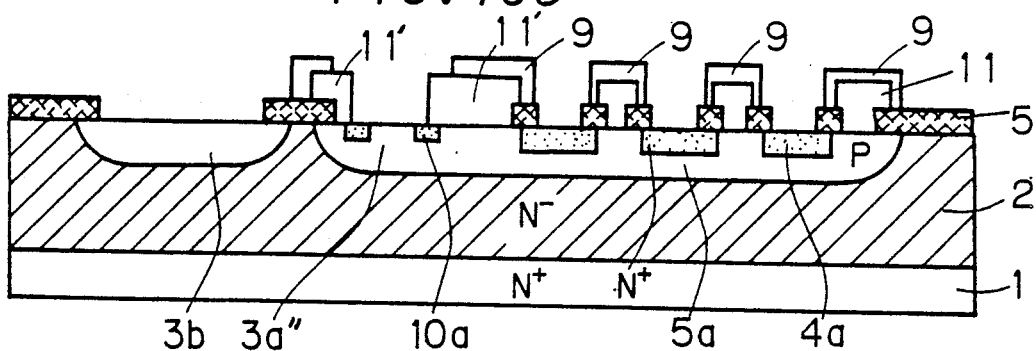
Figure 10D:
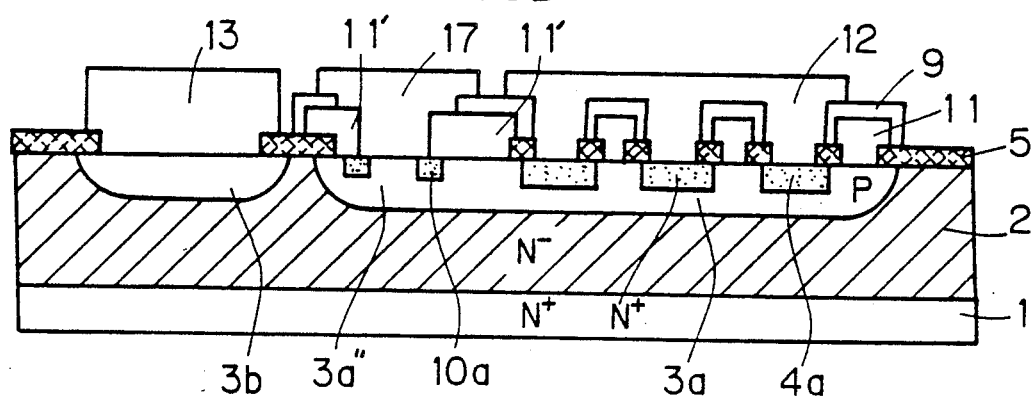
Figure 11C:
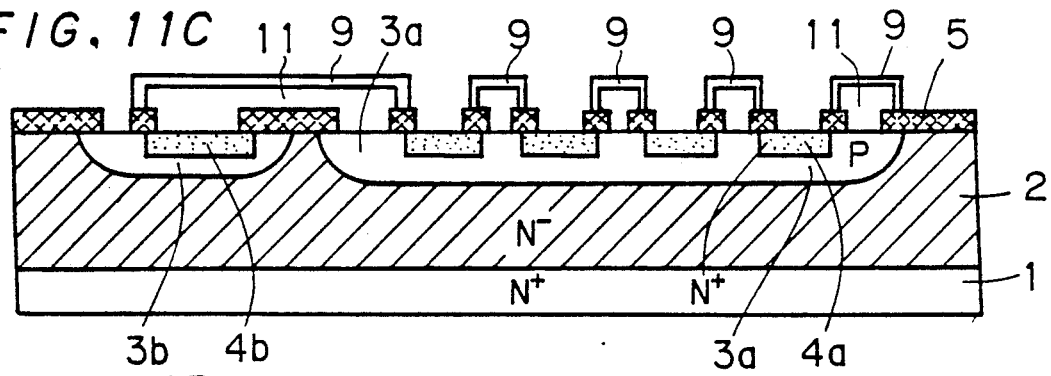
Figure 11D:
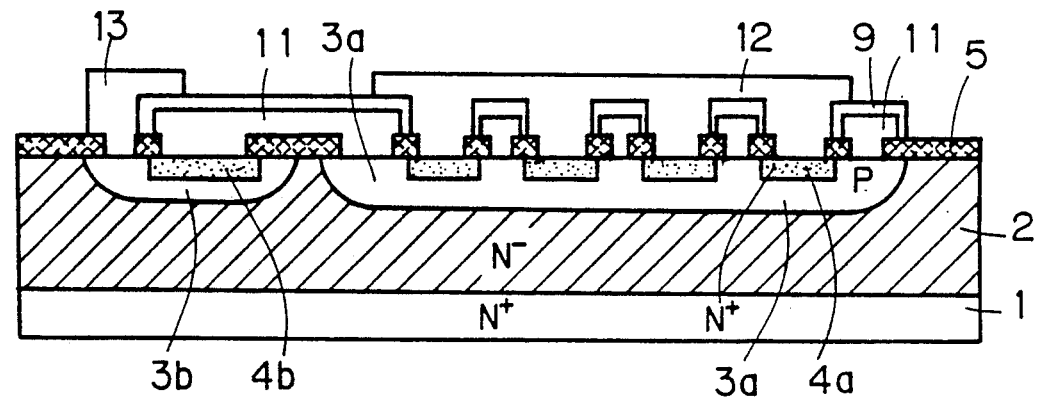

An insulating film is formed over the entire surface and selectively etched to leave a portion covering the base/emitter electrode 11, thereby to form the interlayer insulation film 9 as shown in FIGS. 10C and 11C. At this time, the interlayer insulation film 9 is so formed as to be exposed by about half in a part 11' of the base/emitter electrode 11.

An aluminum layer is again formed by vacuum deposition and etched to form the emitter electrode 12 on the $N^{30}$-type emitter regions 3a, the base/emitter bonding region 17 on the partial region 3a'' of the P-type well region 3a and the partial region 11' of the base/emitter electrode 11, and the base electrode 13 on the P-type base region 3b respectively.

In addition to the effect of the second embodiment, the power transistor fabricated in the aforementioned manner has the bonding region also on the electrode between the base and the emitter of the transistors Qa and Qb, whereby a speed-up diode D1, which is fed back from the base of the transistor Qa to that of the transistor Qb, can be externally provided.

An electrical barrier defined in a contact portion between the base/emitter bonding region 17 and the base/emitter electrode 11' substantially causes no problem similarly to the electrical barrier defined in the contact portion between the base bonding region 8 and the base electrode 6b in the first embodiment.

Figure 12A:
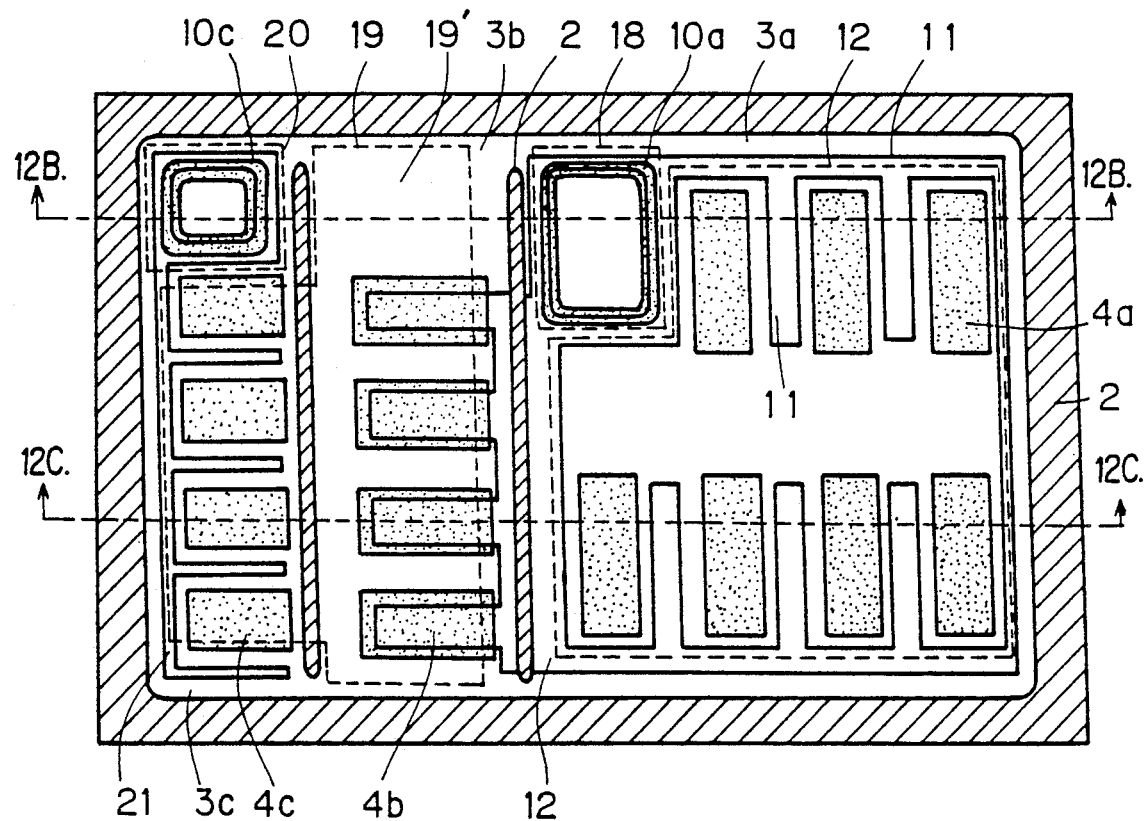
FIG. 12A is a plan view showing a power transistor having a three-stage Darlington-connected structure and provided with base-to-emitter bonding regions according to the fifth embodiment of the present invention.
Figure 12B:
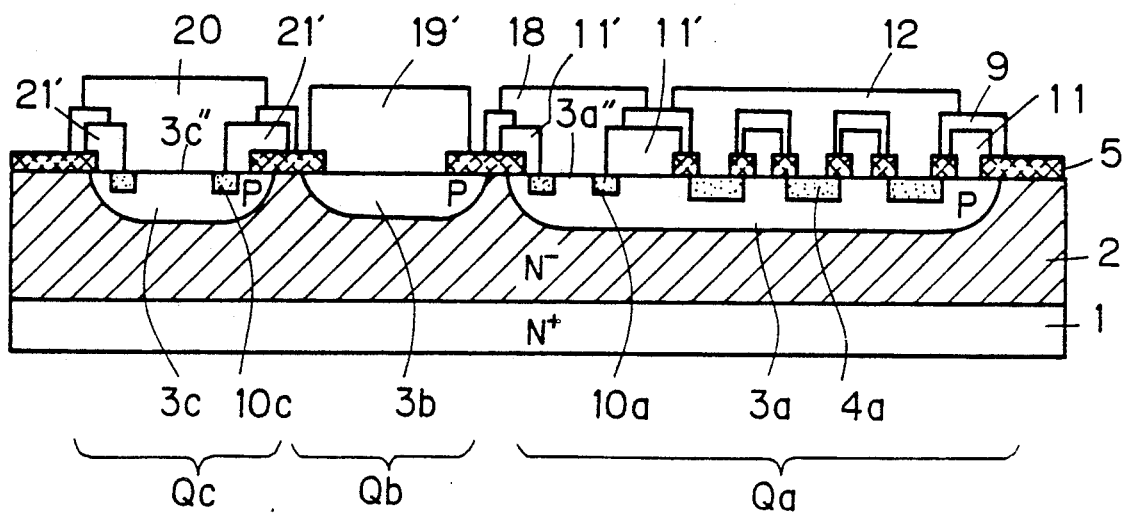
FIG. 12B is a sectional view taken along the line C8–C8 in FIG. 12A.
Figure 12C:
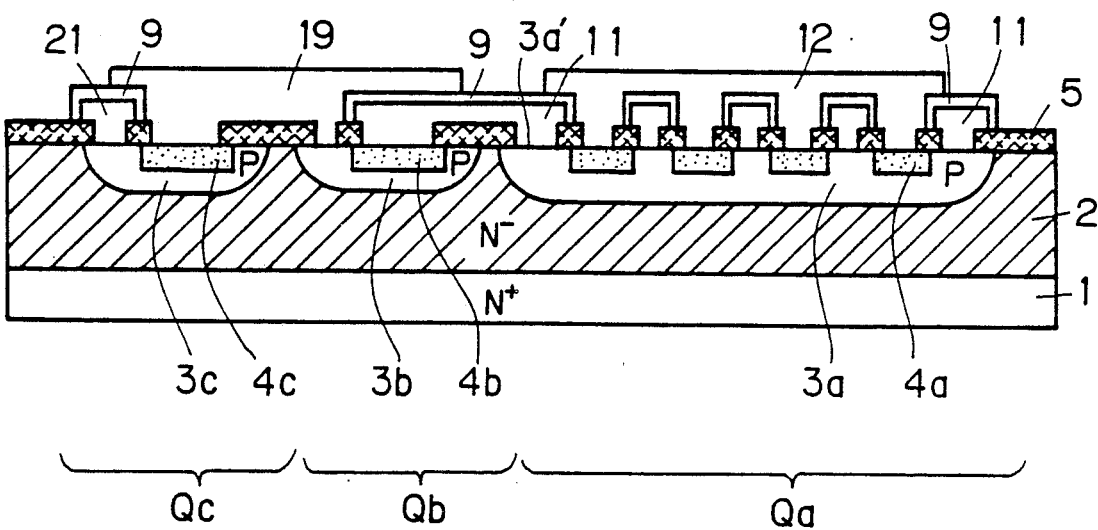
FIG. 12C is a sectional view taken along the line C9–C9 in FIG. 12A.

FIG. 12A is a plan view showing a power transistor having three-stage Darlington-connected structure which is provided with bonding regions also on base/emitter electrodes according to the fifth embodiment of the present invention, and FIGS. 12B and 12C are sectional views taken along the lines C8–C8 and C9–C9 in FIG. 12A respectively. As shown in these figures, an $N^-$-type collector layer 2 is formed on an $N^+$-type collector layer 1. P-type well regions 3a to 3c are formed on an upper layer part of the $N^-$-type collector layer 2 to serve as base regions of transistors Qa to Qc respectively. Pluralities of $N^+$-type emitter regions 4a to 4c are formed on partial surface regions of the P-type well regions 3a to 3c respectively. Low-resistance regions 10a and 10c are provided in the form of rings on surface parts of the P-type well regions 3a and 3c respectively.

Oxide films 5 are selectively formed on the following regions:

(1) a region over the $N^-$-type collector layer 2 and an end portion of the P-type well region 3a (2) regions close to boundaries between the P-type well region 3a and the $N^{30}$-type emitter regions 4a (3) region(s) over another end portion of the P-type well region 3a and regions close to boundaries between the P-type well region 3b and the $N^{30}$-type emitter region 4b or an end portion of the P-type well region 3b through the $N^-$-type collector layer 2

(4) regions close to the boundaries between the P-type well region 3b and the $N^{30}$-type emitter regions 4b (5) region(s) over another end portion of the P-type well region 3b and regions close to boundaries between the P-type well region 3c and the $N^+$-type emitter regions 4c or an end portion of the P-type well region 3c through the $N^-$-type collector layer 2

(6) regions close to boundaries between the P-type well region 3c and the $N^+$-type emitter regions 4c (7) a region over another end portion of the P-type well region 3c and the $N^-$-type collector layer 2.

A base/emitter electrode 11, which is an electrode electrically connecting the base of the transistor Qa and the emitter of the transistor Qb, is formed over the P-type well region 3a excluding a region 3a'' enclosed by the ring-shaped low-resistance region 10a, a partial region 3a' of the P-type well region 3a and the $N^{30}$-type emitter regions 4b. A base electrode 21 of the transistor Qc is formed on the P-type well region 3c excluding a region 3c'' enclosed by the ring-shaped low-resistance region 10c.

An interlayer insulation film 9 is formed to cover the electrodes 11 and 21, to be exposed by about half in parts 11' and 21' of the electrodes 11 and 21. An emitter electrode 12 of the transistor Qa is formed on a region including the overall $N^+$-type emitter regions 4a and the interlayer insulation film 9 formed between the $N^{30}$-type emitter regions 4a.

A base/emitter bonding region 18 is formed on the part 3a'' of the P-type well region 3a and the part 11' of the base electrode 11, while another base/emitter bonding region 20 is formed on the part 3c'' of the P-type well region 3c and the part 21' of the base electrode 21. Further, a base/emitter electrode 19, which electrically connects the base of the transistor Qb with the emitter of the transistor Qc, is formed over the P-type well region 3b and the $N^+$-type emitter regions 4c. A partial region 19' of the base/emitter electrode 19 serves as a bonding region.

Figure 12D:
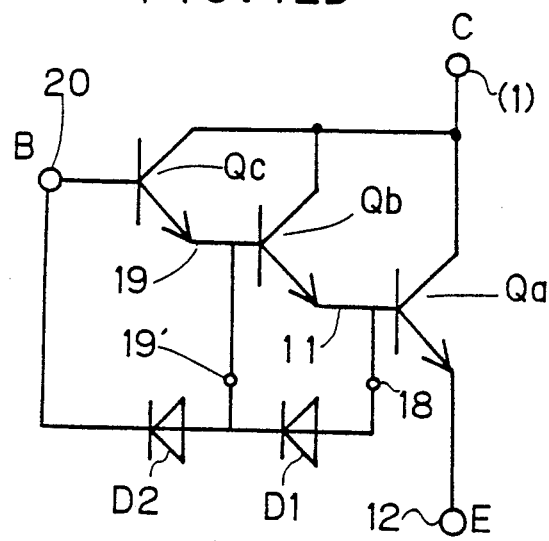
FIG. 12D is an equivalent circuit diagram of the embodiment shown in FIG. 12A.

FIG. 12D is an equivalent circuit diagram showing the power transistor having the aforementioned three-stage Darlington-connected structure. As shown in FIG. 12D, the base/emitter electrodes 11 and 19 electrically connect the bases and the emitters of the adjacent pairs of transistors, while the emitter electrode 12 serves as the emitter electrode of the transistor Qa in the final stage (third stage) capable of external connection by bonding. The base/emitter bonding region 18 and the part 19' of the base/emitter electrode 19 serve as external terminal connecting regions between the bases and the emitters of the transistors Qa and Qb as well as Qb and Qc. Further, the base electrode 21 and the base bonding region 20 serve as the base electrode of the transistor Qc having an externally connectable bonding region.

Detailed description of a method of fabricating the power transistor having three-stage Darlington-connected structure according to the fifth embodiment is omitted since the method is basically similar to that of fabricating the transistor according to the fourth embodiment. In the fifth embodiment, the base/emitter electrode 11 and the base electrode 21 are formed in a first electrode forming step (corresponding to the step of the fourth embodiment shown in FIGS. 10B and 11B), while the emitter electrode 12, the base/emitter bonding region 18, the base/emitter electrode 19 and the base bonding region 20 are formed in a second electrode/bonding region forming step (corresponding to the step of the fourth embodiment shown in FIGS. 10D and 11D).

Thus, the bonding regions can be provided between the bases and the emitters of the adjacent pairs of transistors also in the power transistor having three-stage Darlington-connected structure, whereby speed-up diodes D1 and D2, which are fed back from the bases of the transistors Qa and Qb to the bases of the transistors Qb and Qc respectively, can be externally provided.

Figure 13A:
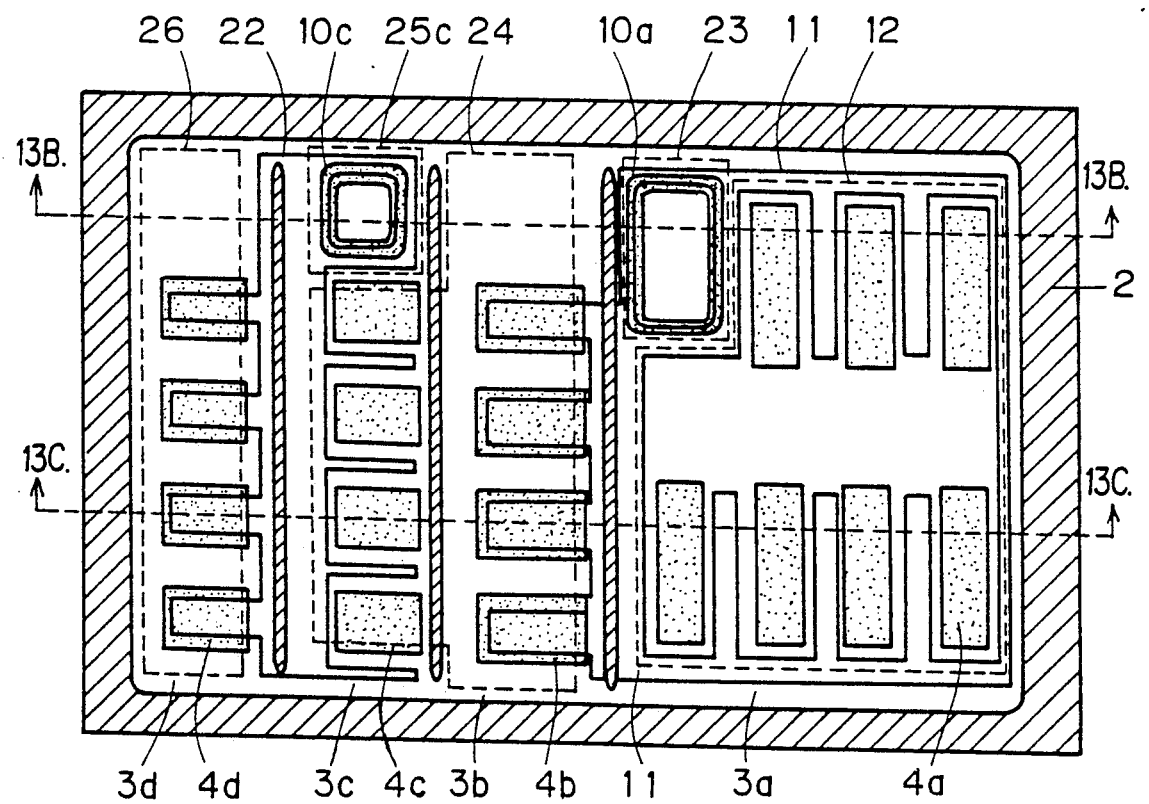
FIG. 13A is a plan view showing a power transistor having four-stage Darlington-connected structure and provided with base-to-emitter bonding regions according to the sixth embodiment of the present invention.
Figure 13B:
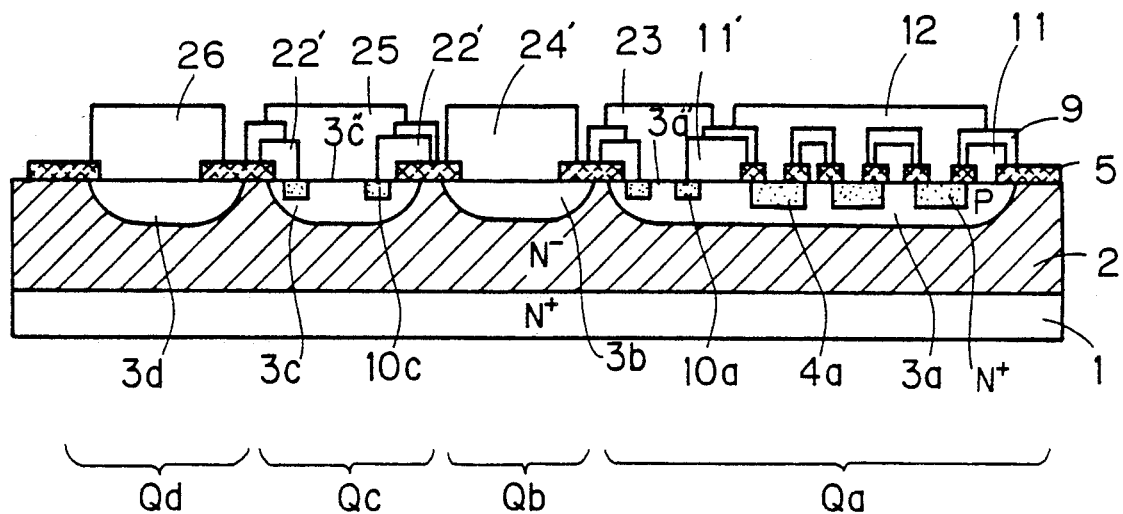
FIG. 13B is a sectional view taken along the line C10–C10 in FIG. 13A.
Figure 13C:
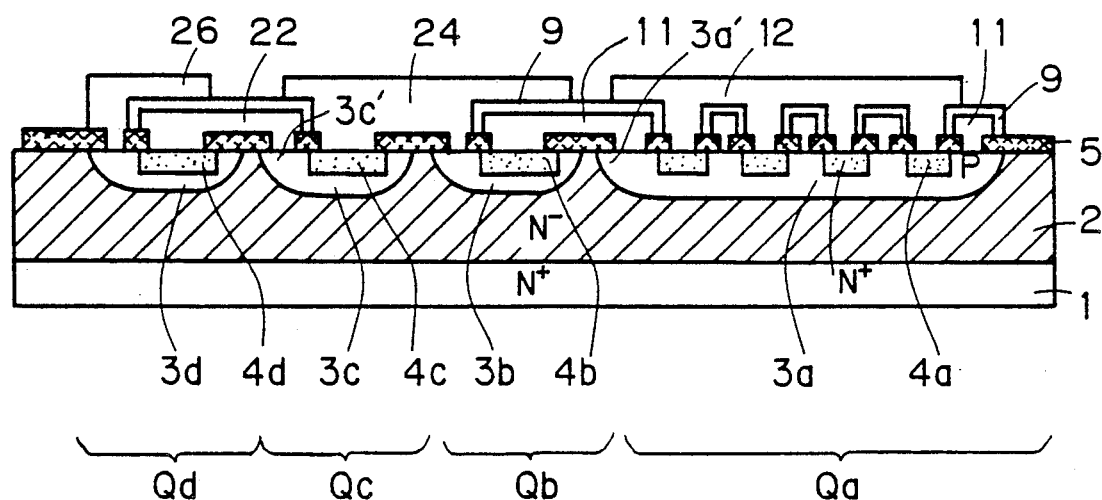
FIG. 13C is a sectional view taken along the line C11–C11 in FIG. 13A.

FIG. 13A is a plan view showing a power transistor having four-stage Darlington-connected structure which is provided with bonding regions also in base/emitter electrodes according to the sixth embodiment of the present invention, and FIGS. 13B and 13C are sectional views taken along the lines C10–C10 and C11–C11 in FIG. 13A respectively. As shown in these figures, an $N^-$-type collector layer 2 is formed on an $N^{30}$-type collector layer 1. P-type well regions 3a to 3d are formed on an upper layer part of the $N^-$-type collector layer 2, to serve as base regions of transistors Qa to Qd respectively. Pluralities of $N^{30}$-type emitter regions 4a to 4d are formed on partial regions of the surfaces of the P-type well regions 3a to 3d respectively. Ring-shaped low-resistance regions 10a and 10c are formed on surface parts of the P-type well regions 3a and 3c respectively. Oxide films 5 are selectively formed on the following regions:

(1) a region over the $N^-$-type collector layer 2 and an end portion of the P-type well region 3a (2) regions close to boundaries between the P-type well region 3a and the $N^{30}$-type emitter regions 4a (3) region(s) over another end portion of the P-type well region 3a and regions close to boundaries between the P-type well region 3b and the $N^{30}$-type emitter regions 4b or an end portion of the P-type well region 3b through the $N^-$-type collector layer 2

(4) regions close to the boundaries between the P-type well region 3b and the $N^{30}$-type emitter regions 4b (5) region(s) over another end portion of the P-type well region 3b and regions close to boundaries between the P-type well region 3c and the $N^{30}$-type emitter regions 4c or an end portion of the P-type well region 3c through the $N^-$-type collector layer 2

(6) regions close to the boundaries between the P-type well region 3c and the $N^{30}$-type emitter regions 4c (7) region(s) over another end portion of the P-type well region 3c and regions close to boundaries between the P-type well region 3d and the $N^{30}$-type emitter regions 4d or an end portion of the P-type well region 3d through the $N^-$-type collector layer 2

(8) regions close to the boundaries between the P-type well region 3d and the $N^+$-type emitter regions 4d (9) a region over another end portion of the P-type well region 3d and the $N^-$-type collector layer 2.

A base/emitter electrode 11, which is an electrode electrically connecting the base of the transistor Qa and the emitter of the transistor Qb, is formed on the P-type well region 3a excluding a region 3a'' enclosed by the ring-shaped low resistance region 10a and over a part 3a' of the P-type well region 3a and the $N^+$-type emitter regions 4b. On the other hand, another base/emitter electrode 22, which is an electrode electrically connecting the base of the transistor Qc and the emitter of the transistor Qd, is formed on the P-type well region 3c excluding a region 3c'' enclosed by the ring-shaped low-resistance region 10c and over a part 3c' of the P-type well region 3c and the $N^{30}$-type emitter regions 4d.

An interlayer insulation film 9 is formed to cover the electrodes 11 and 12, to be exposed by about half in parts 11' and 22' of the electrodes 11 and 12.

A base/emitter bonding region 23 is formed on the part 3a'' of the P-type well region 3a and the part 11' of the base electrode 11, and another base/emitter bonding region 25 is formed on the part 3c'' of the P-type well region 3c and the part 22' of the base/emitter electrode 22. Further, still another base/emitter electrode 24 is formed on regions over the P-type well region 3b and the $N^{30}$-type emitter regions 4c and on the interlayer insulation film 9 provided on the $N^{30}$-type emitter regions 4b, while a base eletctrode 26 is formed on the P-type well region 3d and the interlayer insulation film 9 provided on the $N^+$-type emitter regions 4d. A partial region 24' of the base/emitter electrode 24 serves as a bonding region.

Figure 13D:
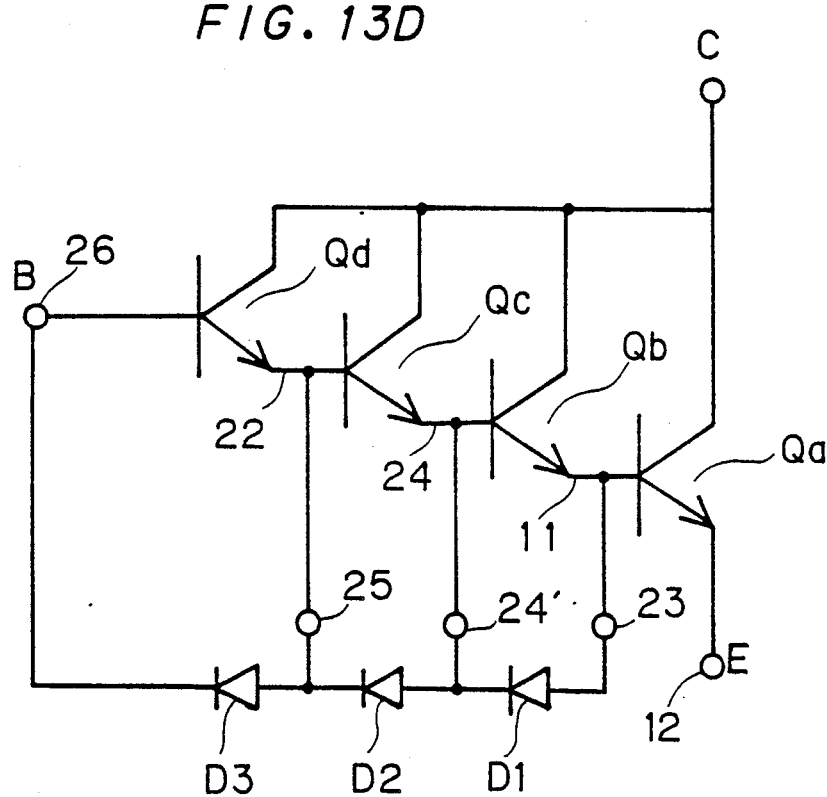
FIG. 13D is an equivalent circuit diagram of the embodiment shown in FIG. 13A.

FIG. 13D is an equivalent circuit diagram showing the transistor having the aforementioned four-stage Darlington-connected structure. As shown in FIG. 13D, the base/emitter electrodes 11, 24 and 22 electrically connect the bases and the emitters of the adjacent pairs of transistors, while the emitter electrode 12 serves as the emitter electrode of the transistor Qa in the final stage (fourth stage) capable of external connection by bonding and the base eletctrode 26 serves as the base electrode of the first stage transistor Qd. Further, the base/emitter bonding region 23, the partial region 24' of the base/emitter electrode 24 and the base/emitter bonding region 25 serve as external terminal connecting bonding regions of the bases and the emitters of the transistors Qa and QB, Qb and Qc, as well as Qc and Qd.

Detailed description of a method of fabricating the power transistor having four-stage Darlington-connected structure according to the sixth embodiment is omitted since the method is basically similar to that of fabricating the transistor according to the fourth embodiment. In the sixth embodiment, the base/emitter electrodes 11 and 22 are formed in a first electrode forming step (corresponding to the step of the fourth embodiment shown in FIGS. 10B and 11B), and the base/emitter bonding regions 23 and 25, the base/emitter electrode 24 and the base electrode 26 are formed in a second electrode/bonding region forming step (corresponding to the step of the fourth embodiment shown in FIGS. 10D and 11D).

In addition to the effect of the third embodiment, the bonding regions are provided between the bases and the emitters of the adjacent pairs of transistors in the power transistor having the aforementioned four-stage Darlington-connected structure, whereby speed-up diodes D1 to D3 can be externally provided between the transistors Qa and Qb, Qb and Qc, and Qc and Qd respectively as shown in FIG. 13D.

Figure 15A:
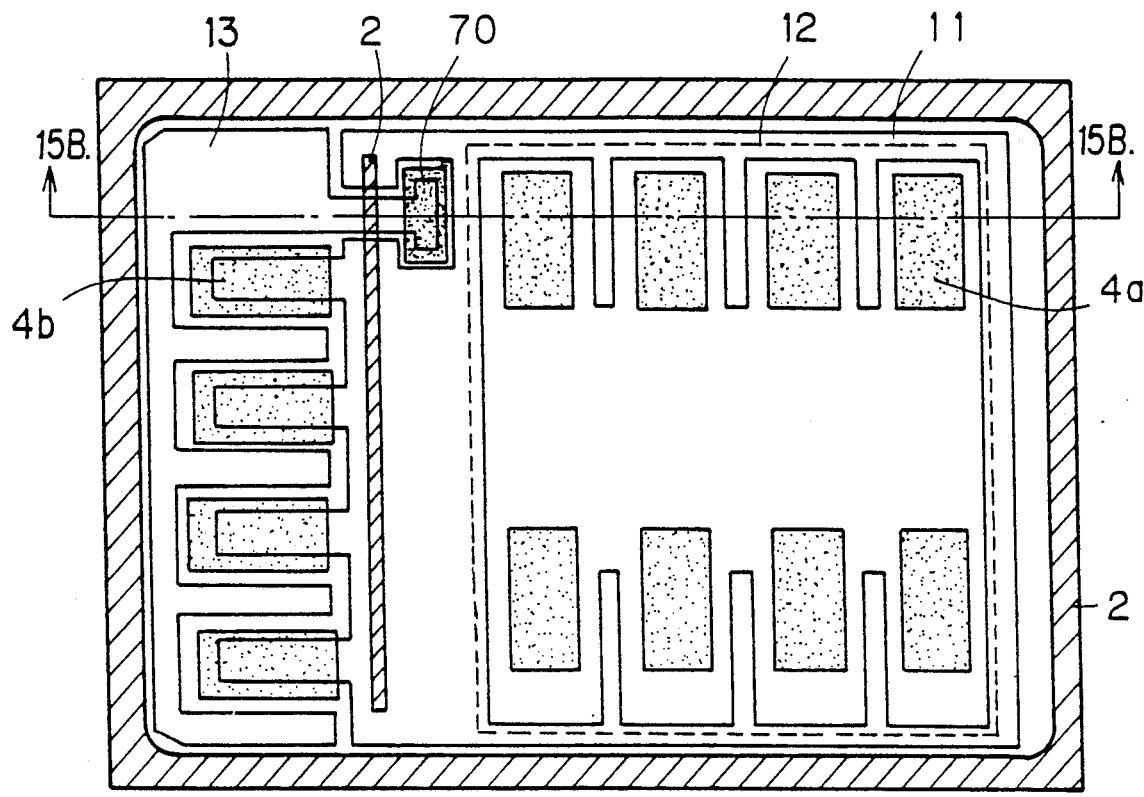
FIG. 15A is a plan view showing a power transistor having a two-stage Darlington-connected structure according to the seventh embodiment of the present invention.
Figure 15B:
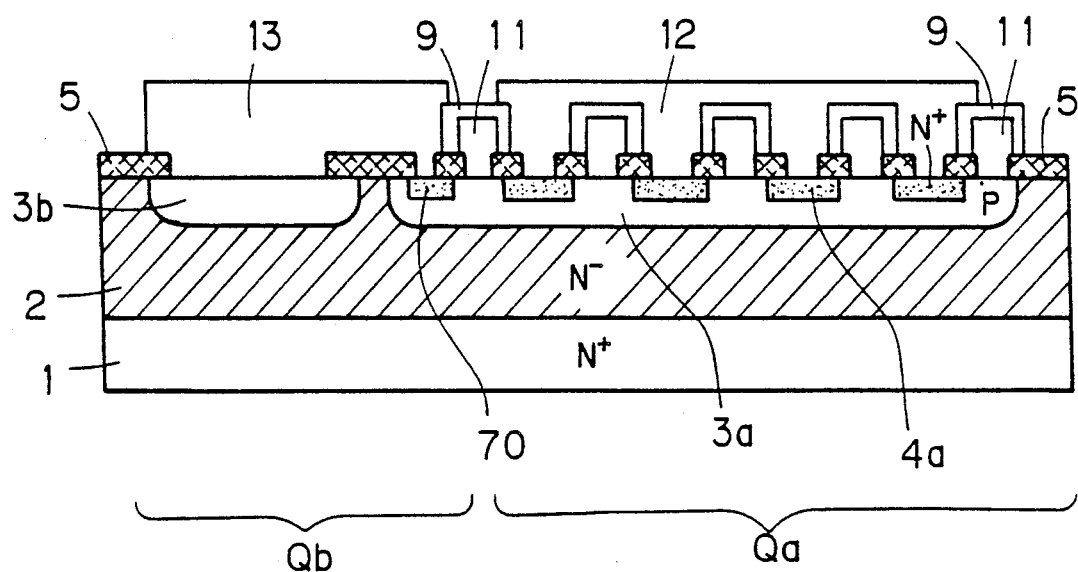
FIG. 15B is a sectional view taken along the line C12–C12 in FIG. 15A.

FIG. 15A is a plan view showing a power transistor having two-stage Darlington-connected structure according to the seventh embodiment of the present invention, and FIG. 15B is a sectional view taken along the line C12–C12 in FIG. 15A. This power transistor is basically similar in structure to the power transistor having two-stage Darlington-connected structure according to the fourth embodiment shown in FIGS. 9A–9D.

In the seventh embodiment, however, the power transistor contains a speed-up diode D1 formed between the base of a transistor Qa and the base of a transistor Qb, as is the difference from the fourth embodiment.

As shown in these figures, a part of a base electrode 13 of the transistor Qb is provided extendedly over a P-type well region $3a$ of the transistor Qa, and an $N^+$-type diffusion region 70 is provided on the surface of the P-type well region $3a$ under the base electrode 13. The speed-up diode D1 is formed between the base of the transistor Qa and the base of the transistor Qb by the PN junction of the P-type well region $3a$ and the $N^+$-type diffusion region 70.

Other structure of the seventh embodiment is similar to that of the fourth embodiment shown in FIGS. 9A–9D, and hence redundant description is omitted. In addition, a method of fabricating the power transistor according to the seventh embodiment is similar to that of fabricating the power transistor according to the fourth embodiment shown in FIGS. 10 and 11 except that the $N^{30}$-type diffusion region 70 is formed before and after the step of forming an $N^{30}$-type emitter region $4a$ and that a bonding region 17 is not formed, and hence redundant description is omitted.

Thus, since the speed-up diode D1 is contained in the power transistor, eliminated is the necessity to provide a part of the region electrically connecting the base of the transistor Qa and the emitter of the transistor Qb with the bonding region 17 for connecting the external speed-up diode D1 according to the fourth embodiment.

The PN junction of the P-type well region $3a$ and the $N^+$-type diffusion region 70 behave not only as a diode but also as a parasitic transistor with an $N^{30}$-type collector layer 1 and an $N^-$-type collector layer 2, and thereby has parasitic transistor operation. For reducing the parasitic transistor operation, it is effective to reduce a current amplification efficiency $h_{FE}$ of the parasitic transistor by carrying out parasitic transistor restraint measures of decreasing the density of the $N^{30}$-type diffusion region 70, increasing the density of the P-type well region $3a$ around the $N^+$-type diffusion region 70, and the like.

Figure 16A:
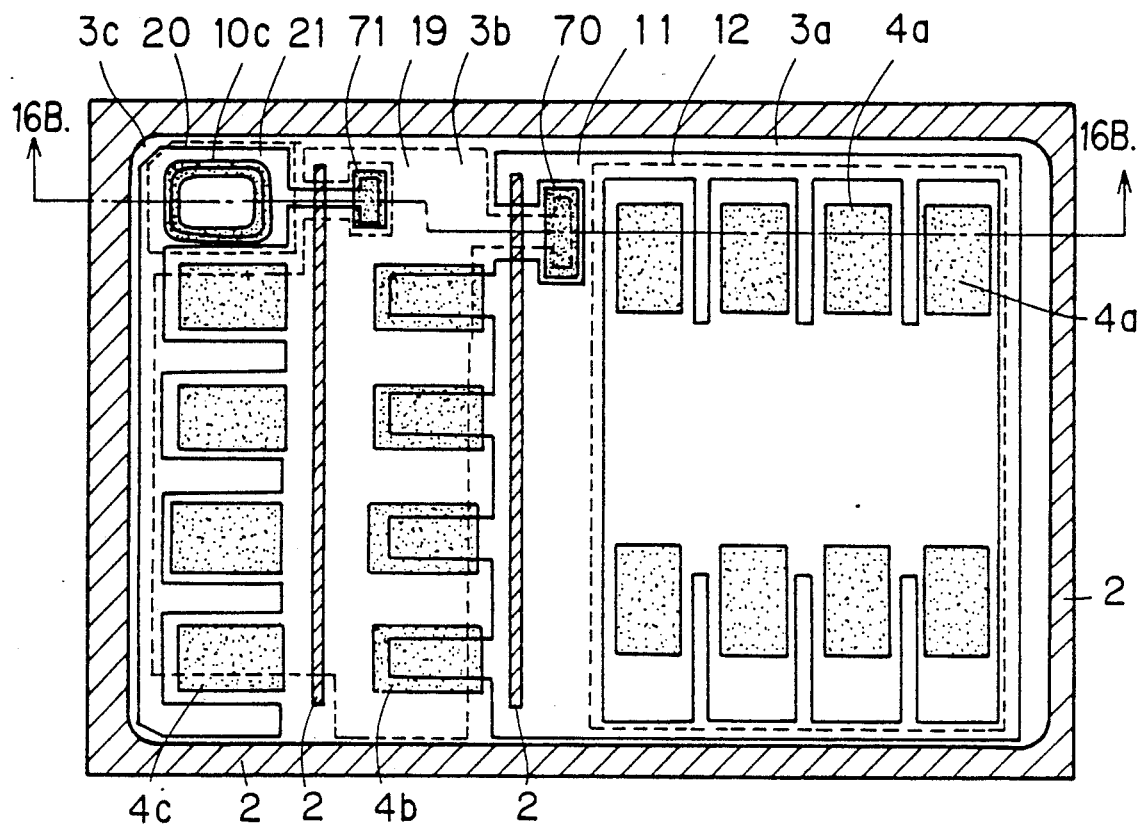
FIG. 16A is a plan view showing a power transistor having a three-stage Darlington-connected structure according to the eighth embodiment of the present invention.
Figure 16B:
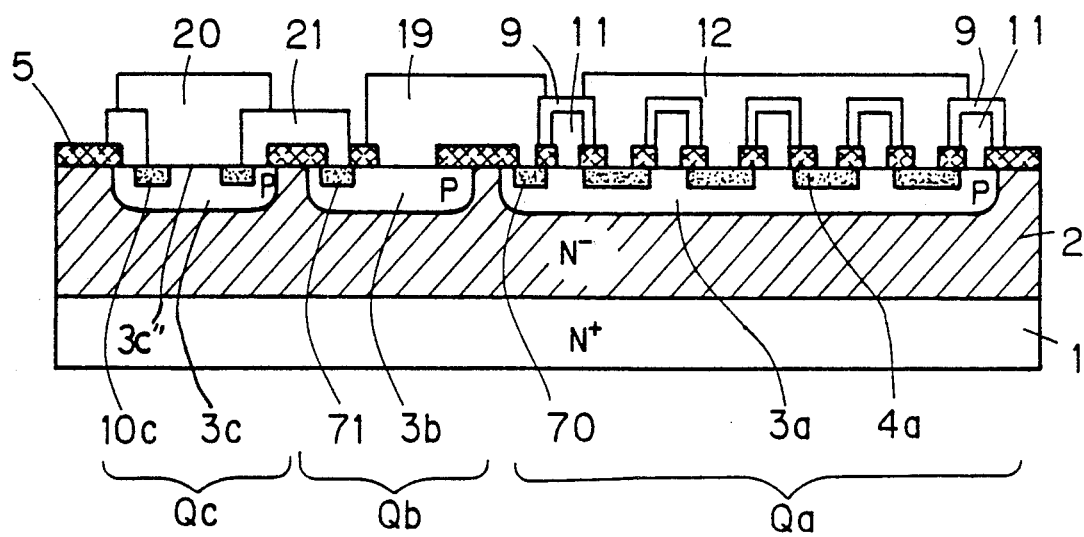
FIG. 16B is a sectional view taken along the line C13–C13 in FIG. 16A.

FIG. 16A is a plan view showing a power transistor staving three-stage Darlington-connected structure according to the eighth embodiment of the present invention, and FIG. 16B is a sectional view taken along the line C13–C13 in FIG. 16A. This power transistor is basically similar in structure to the power transistor having three-stage Darlington-connected structure according to the fifth embodiment shown in FIGS. 12A–12D.

In the eighth embodiment, however, the power transistor contains speed-up diodes D1 and D2 which are fed back from the bases of transistors Qa and Qb to the bases of transistors Ob and Qc respectively, as is the difference from the fifth embodiment.

As shown in these figures, a part of a base/emitter electrode 19 of the transistors Qb and Qc is provided extendedly over a P-type well region $3a$ of the transistor Qa, and an $N^+$-type diffusion region 70 is provided on the surface of the P-type well region $3a$ under the base/emitter electrode 19. A part of a base electrode 21 of the transistor Qc is provided extendedly over a P-type well region $3b$, and an $N^{30}$-type diffusion region 71 is provided on the surface of the P-type well region $3b$ under the base electrode 21. The speed up diode D1 is formed between the base of the transistor Qa and the base of the transistor Qb by the PN junction of the P-type well region $3a$ and the $N^+$-type diffusion region 70. The speed-up diode D2 is formed between the base of the transistor Qb and the base of the transistor Qc by the PN junction of the P-type well region $3b$ and the $N^+$-type diffusion region 71.

Other structure of the eighth embodiment is similar to that of the fifth embodiment shown in FIGS. 12A–12D, and hence redundant description is omitted. In addition, a method of fabricating the power transistor according to the eighth embodiment is similar to that of fabricating the power transistor according to the fifth embodiment except that the $N^{30}$-type diffusion regions 70 and 71 are formed before and after the step of forming an $N^{30}$-type emitter region $4a$ and $4b$, and that bonding regions 18 and 19' are not formed, and hence redundant description is omitted.

Thus, since the speed-up diodes D1 and D2 tare contained in the power transistor, eliminated is the necessity to provide a part of the region electrically connecting the base of the transistor Qa and the emitter of the transistor Qb and a part of the region electrically connecting the base of the transistor Qb and the emitter of the transistor Qc with the bonding regions 18 and 19' for connecting the external speed-up diodes D1 and D2 according to the fifth embodiment.

When the speed-up diodes are contained in the power transistor, the parasitic transistor operation described above is generated. However, if the parasitic transistor restraint measures described in the seventh embodiment are carried out, its adverse effects can be minimized.

Figure 17A:
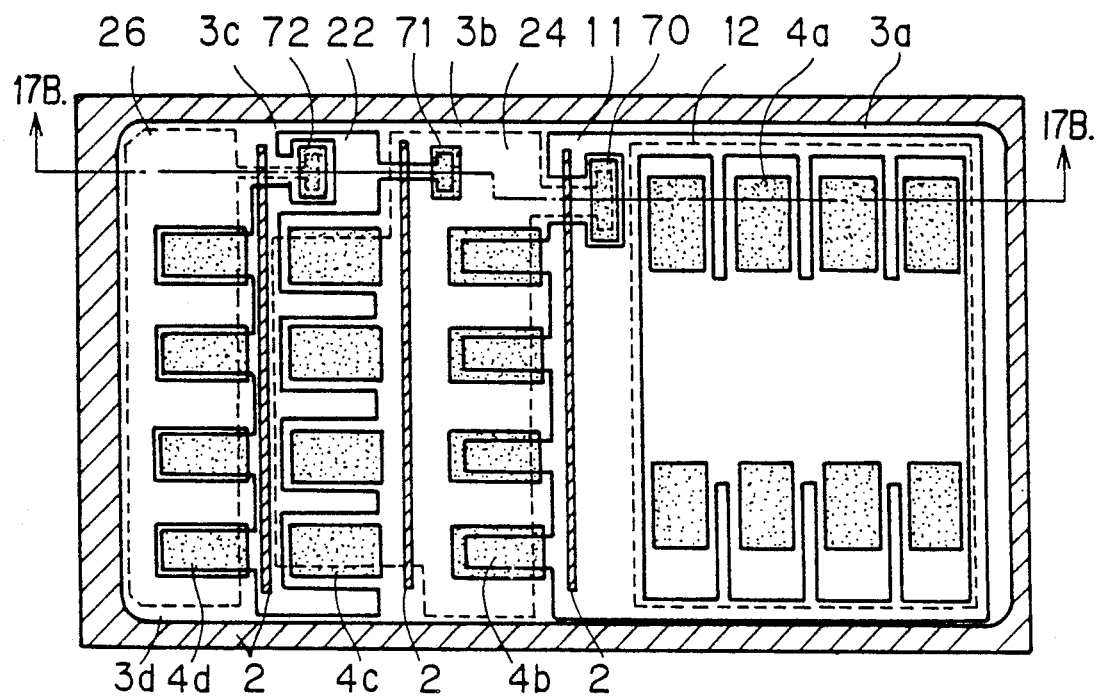
FIG. 17A is a plan view showing a power transistor having a four-stage Darlington-connected structure according to the ninth embodiment of the present invention.
Figure 17B:
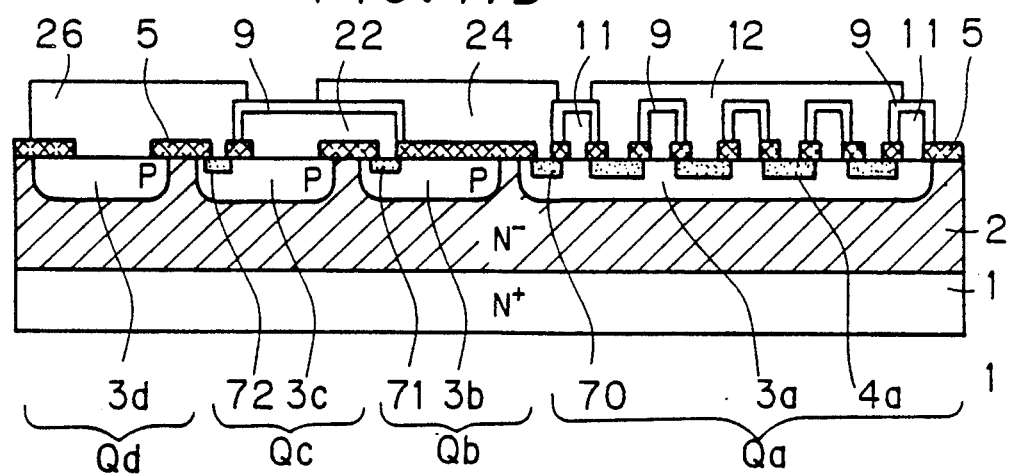
FIG. 17B is a sectional view taken along the line C14–C14 in FIG. 17A.

FIG. 17A is a plan view showing a power transistor having four-stage Darlington-connected structure according to the ninth embodiment of the present invention, and FIG. 17B is a sectional view taken along the line C14–C14 in FIG. 17A. This power transistor is basically similar in structure to the power transistor having four-stage Darlington-connected structure according to the sixth embodiment shown in FIGS. 13A–13D.

In the ninth embodiment, however, the power transistor contains speed-up diodes D1, D2 and D3 which are fed back from he bases of transistors Qa, Qb and Qc to the bases of transistors Qb, Qc and Qd respectively, as is the difference from the sixth embodiment.

As shown in these figures, a part of a base/emitter electrode 24 of the transistors Qb and Qc is provided extendedly over a P-type well region 3a of the transistor Qa, and an $N^{30}$-type diffusion region 70 is provided on the surface of the P-type well region 3a under the base/emitter electrode 24. A part of a base/emitter electrode 22 of the transistors Qc and Qd is provided extendedly over a P-type well region 3b of the transistor Qb, and an $N^+$-type diffusion region 71 is provided on the surface of the P-type well region 3b under the base/emitter electrode 22. A part of a base electrode 26 of the transistor Qd is provided extendedly over a P-type well region 3c, and an $N^+$-type diffusion region 72 is provided on the surface of the P-type well region 3c under the base electrode 26. The speed-up diode D1 is formed between the base of the transistor Qa and the base of the transistor Qb by the PN junction of the P-type well region 3a and the $N^{30}$-type diffusion region 70. The speed-up diode D2 is formed between the base of the transistor Qb and the base of the transistor Qc by the PN junction the P-type well region 3b and the $N^{30}$-type diffusion region 71. The speed-up diode D3 is formed between the base of the transistor Qc and the base of the transistor Qd by the PN junction of the P-type well region 3c and the $N^{30}$-type diffusion region 72.

Other structure of the ninth embodiment is similar to that of the sixth embodiment shown in FIGS. 13A–13D, and hence redundant description is omitted. In addition, a method of fabricating the power transistor according to the ninth embodiment is similar to that of fabricating the power transistor according to the sixth embodiment except that the $N^{30}$-type diffusion regions 70, 71 and 72 are formed before and after the step of forming an $N^{30}$-type emitter region 4a, 4b and 4c, and that bonding regions 23, 24' and 25 are not formed, and hence redundant description is omitted.

Thus, since the speed-up diodes D1, D2 and D3 are contained in the power transistor, eliminated is the necessity to provide a part of the region electrically connecting the base of the transistor Qb and the emitter of the transistor Qc, a part of the region electrically connecting the base of the transistor Qc and the emitter of the transistor Qd and a part of the base electrode region of the transistor Qd with the bonding regions 23, 24' and 25 for connecting the external speed-up diodes D1, D2 and D3 according to the sixth embodiment.

When the speed-up diodes are contained in the power transistor, he parasitic transistor operation described above is generated. However, if the parasitic transistor restraint measures described in the seventh embodiment are carried out, its adverse effects can be minimized.

Although the present invention is applied to a single power transistor and power transistors having two-stage to four-stage Darlington-connected structure in the above embodiments, the present invention is also applicable to a power transistor having Darlington-connected structure including five or more stages by modifying the aforementioned embodiments. It is of course possible to also form a bonding region between the base and the emitter of an adjacent pair of transistors. Further, the present invention is not restricted to the power transistor but is also applicable to a general thyristor, a gate turn off thyristor (GTO) or the like.

Figure 14:
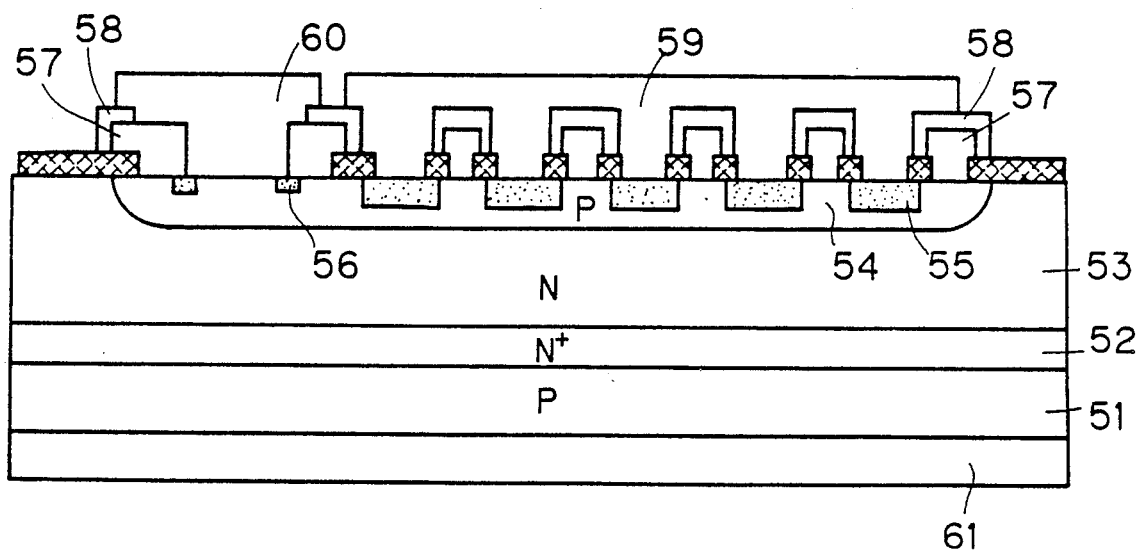
FIG. 14 is a sectional view showing a thyristor to which the present invention is applied.

Referring to FIG. 14, numeral 51 denotes a P-type substrate, numeral 52 denotes an N-type buffer layer, numeral 53 denotes an N-type semiconductor layer, numeral 54 denotes a P-type well region, numeral 55 denotes an N-type diffusion region, numeral 56 denotes a low-resistance region, numerals 57 and 60 denote gate electrodes, numeral 58 denotes an interlayer insulation film, numeral 59 denotes an anode electrode and numeral 61 denotes a cathode electrode.

As a matter of course, the configuration of a second-layer electrode (including a bonding region) formed on the $N^-$-collector layer 2 is not restricted to the above. Such an eletctrode may be formed in a comb-like pattern similarly to the base electrode 13 (see FIG. 9) of the fourth embodiment, or in overlay structure similarly to the base electrode 26 (see FIG. 13) of the sixth embodiment and base/emitter electrode 24 (see FIG. 17) of the seventh embodiment. In general, a preferable result is expected in the overlay structure in view of current supply ability, while the proportion defective is disadvantageously increased in this case since the structure is complicated. Supposing from the above reason, it may be preferable to form the emitter electrode (the emitter electrode 12 of FIG. 13, for example) of the final stage, having the highest current density, in overlay structure while forming other electrodes in comb-like patterns in Darlington-connected transistors.

While the emitter electrode of the final stage transistor is in substantially rectangular overlay structure in each of the aforementioned embodiments, the present invention is not restricted to this and the emitter electrode may be provided in the form of a lattice or mesh so far as the configuration is adapted to expand an effective operating region. Further, the base electrode of the final stage transistor is not restricted to the comb-like configuration shown in each embodiment. For example, electrode connecting portions of an emitter region may be discretely formed so that the base electrode can be provided on the emitter region, which is not an electrode connecting portion, through an oxide film to expand a base electrode forming area, thereby to increase base current supply ability.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A semiconductor device, comprising:
   a first conductivity type first semiconductor layer having first and second major surfaces;
   a second conductivity type first semiconductor region selectively formed on said first major surface of said first semiconductor layer, said first semiconductor region having first and second portions, said first portion being much longer than said second portion;

a first conductivity type second semiconductor region selectively formed on a surface of said first semiconductor region;

a low-resistance region selectively formed on the surface of said first semiconductor region separately from said second semiconductor region;

a first electrode region formed on said first portion of said first semiconductor region and a part of said low-resistance region and having first and second portions;

an insulating film formed to cover said first portion of said first electrode region;

a second electrode region formed on said second semiconductor region and said insulating film; and a third electrode region formed on said second portion of said first semiconductor region, on another part of said low-resistance region and on said second portion of said first electrode.

2. A semiconductor device in accordance with claim 1, further comprising:

a second conductivity type second semiconductor layer formed on said second major surface of said first semiconductor layer; and a fifth electrode region formed on said second semiconductor layer.

3. A semiconductor device, comprising:

a first conductivity type first semiconductor layer;

a second conductivity type first semiconductor region selectively formed on said first semiconductor layer;

a first conductivity type second semiconductor region selectively formed on a surface of said first semiconductor region;

a second conductivity type third semiconductor region selectively formed on said first semiconductor layer separately from said first semiconductor region;

a first conductivity type fourth semiconductor region selectively formed on a surface of said third semiconductor region;

a first electrode region formed on said first semiconductor region and said fourth semiconductor region;

an insulating film formed to cover said first electrode region;

a second electrode region formed on said second semiconductor region and said insulating film; and a third electrode region formed on said third semiconductor region and said insulating film separately from said second electrode region.

4. A semiconductor device, comprising:

a first conductivity type first semiconductor layer;

a second conductivity type first semiconductor region selectively formed on said first semiconductor layer, said first semiconductor region having first and second portions, said first portion being much larger than said second portion;

a first conductivity type second semiconductor region selectively formed on a surface of said first semiconductor region;

a low-resistance region selectively formed on the surface of said first semiconductor region separately from said second semiconductor region;

a second conductivity type third semiconductor region selectively formed on said first semiconductor layer separately from said first semiconductor region;

a first conductivity type fourth semiconductor region selectively formed on a surface of said third semiconductor region;

a first electrode region formed on said first portion of said first semiconductor region, said fourth semiconductor region and a part of said low-resistance region and having first and second portions;

an insulating film formed to cover said first portion of said first electrode region;

a second electrode region formed on said second semiconductor region and said insulating film;

a third electrode region formed on said third semiconductor region and said insulating film separately from said second electrode region; and a fourth electrode region formed on said second portion of said first semiconductor region, on another part of said low-resistance region and on said second portion of said first electrode.

5. A semiconductor device in accordance with claim 4, wherein said second electrode region includes an electrode region of overlay structure.

6. A semiconductor device, comprising:

a first conductivity type first semiconductor layer;

a second conductivity type first semiconductor region selectively formed on said first semiconductor layer;

a first conductivity type second semiconductor region selectively formed on a surface of said first semiconductor region;

a second conductivity type third semiconductor region selectively formed on said first semiconductor layer separately from said first semiconductor region;

a first conductivity type fourth semiconductor region selectively formed on a surface of said third semiconductor region;

a first conductivity type fifth semiconductor region selectively formed on a surface of said first semiconductor region separately from said second semiconductor region;

a first electrode region formed on said first semiconductor region and said fourth semiconductor region;

an insulating film formed to cover said first electrode region;

second electrode region formed on said second semiconductor region and said insulating film; and a third electrode region formed on said third semiconductor region, said fifth semiconductor region and said insulating film separately from said second electrode region.

* * * * *